US010305196B2

(12) United States Patent
Redd

(10) Patent No.: US 10,305,196 B2
(45) Date of Patent: May 28, 2019

(54) DIELECTRIC LENS STRUCTURES FOR EHF RADIATION

(71) Applicant: Keyssa, Inc., Mountain View, CA (US)

(72) Inventor: Justin Redd, Portland, OR (US)

(73) Assignee: KEYSSA, INC., Mountain View, CA (US)

( * ) Notice: Subject to any disclaimer, the term of this patent is extended or adjusted under 35 U.S.C. 154(b) by 597 days.

(21) Appl. No.: 13/865,105

(22) Filed: Apr. 17, 2013

(65) Prior Publication Data

US 2013/0271331 A1   Oct. 17, 2013

Related U.S. Application Data

(60) Provisional application No. 61/625,575, filed on Apr. 17, 2012.

(51) Int. Cl.
*H01Q 19/06* (2006.01)

(52) U.S. Cl.
CPC .......... *H01Q 19/06* (2013.01); *H01Q 19/062* (2013.01); *H01L 2224/05554* (2013.01);
(Continued)

(58) Field of Classification Search
CPC . H01L 2224/48091; H01L 2224/48227; H01L 2924/181; H01L 2224/49171; H01L 2224/73265; H01L 2224/05554; H01L 2924/15311; H01L 2224/16225; H01L 2224/32225; H01Q 19/06; H01Q 19/062
(Continued)

(56) References Cited

U.S. PATENT DOCUMENTS 3,796,831 A    3/1974   Bauer
4,239,340 A * 12/1980   Ogino .................... G02B 15/02
                                                            359/675
(Continued)

FOREIGN PATENT DOCUMENTS

EP    0 515 187 A2   11/1992
EP    0789421 A2   8/1997
(Continued)

OTHER PUBLICATIONS

Chinese First Office Action, Chinese Application No. 201380026884. 1, dated Aug. 28, 2015, 19 pages.
(Continued)

*Primary Examiner* — Hoang V Nguyen
*Assistant Examiner* — Jae K Kim
(74) *Attorney, Agent, or Firm* — Fenwick & West LLP

(57) ABSTRACT

Communication devices for communicating using EHF electromagnetic radiation that include a dielectric lens configured to refract incident EHF electromagnetic radiation. The communication device may include an integrated circuit (IC) package that in turn includes a transducer configured to transmit and/or receive an EHF electromagnetic signal and convert between electrical signals and electromagnetic signals. The integrated circuit package also includes an integrated circuit including at least one of a transmitter circuit and a received circuit that is operatively coupled to the transducer. The dielectric lens is generally disposed so as to enhance transmission or reception of the EHF electromagnetic signal by the transducer.

8 Claims, 15 Drawing Sheets

(52) U.S. Cl.
CPC ............... *H01L 2224/16225* (2013.01); *H01L 2224/32225* (2013.01); *H01L 2224/48091* (2013.01); *H01L 2224/48227* (2013.01); *H01L 2224/49171* (2013.01); *H01L 2224/73265* (2013.01); *H01L 2924/15311* (2013.01); *H01L 2924/181* (2013.01)

(58) Field of Classification Search
USPC ........................................................ 343/753
See application file for complete search history.

(56) References Cited

U.S. PATENT DOCUMENTS

| | | | |
|---|---|---|---|
| 4,485,312 | A | 11/1984 | Kusakabe et al. |
| 4,497,068 | A | 1/1985 | Fischer |
| 4,694,504 | A | 9/1987 | Porter et al. |
| 4,895,075 | A * | 1/1990 | Munzel ................. F42C 13/04 102/211 |
| 5,543,808 | A | 8/1996 | Feigenbaum et al. |
| 5,621,913 | A | 4/1997 | Tuttle et al. |
| 5,754,948 | A | 5/1998 | Metze |
| 5,773,878 | A | 6/1998 | Lim et al. |
| 5,861,782 | A | 1/1999 | Saitoh |
| 5,956,626 | A | 9/1999 | Kaschke et al. |
| 6,351,237 | B1 | 2/2002 | Martek et al. |
| 6,490,443 | B1 | 12/2002 | Freeny, Jr. |
| 6,492,973 | B1 | 12/2002 | Kuroki et al. |
| 6,534,784 | B2 | 3/2003 | Eliasson et al. |
| 6,542,720 | B1 | 4/2003 | Tandy |
| 6,590,544 | B1 | 7/2003 | Filipovic |
| 6,607,136 | B1 | 8/2003 | Atsmon et al. |
| 6,718,163 | B2 | 4/2004 | Tandy |
| 6,915,529 | B1 | 7/2005 | Suematsu et al. |
| 6,967,347 | B2 | 11/2005 | Estes et al. |
| 7,107,019 | B2 | 9/2006 | Tandy |
| 7,213,766 | B2 | 5/2007 | Ryan et al. |
| 7,311,526 | B2 | 12/2007 | Rohrbach et al. |
| 7,512,395 | B2 | 3/2009 | Beukema et al. |
| 7,517,222 | B2 | 4/2009 | Rohrbach et al. |
| 7,593,708 | B2 | 9/2009 | Tandy |
| 7,598,923 | B2 | 10/2009 | Hardacker et al. |
| 7,599,427 | B2 | 10/2009 | Bik |
| 7,612,630 | B2 | 11/2009 | Miller |
| 7,617,342 | B2 | 11/2009 | Rofougaran |
| 7,645,143 | B2 | 1/2010 | Rohrbach et al. |
| 7,656,205 | B2 | 2/2010 | Chen et al. |
| 7,664,461 | B2 | 2/2010 | Rofougaran et al. |
| 7,760,045 | B2 | 7/2010 | Kawasaki |
| 7,761,092 | B2 | 7/2010 | Desch et al. |
| 7,768,457 | B2 | 8/2010 | Pettus et al. |
| 7,769,347 | B2 | 8/2010 | Louberg et al. |
| 7,778,621 | B2 | 8/2010 | Tandy |
| 7,791,167 | B1 | 9/2010 | Rofougaran |
| 7,820,990 | B2 | 10/2010 | Schroeder et al. |
| 7,889,022 | B2 | 2/2011 | Miller |
| 7,907,924 | B2 | 3/2011 | Kawasaki |
| 7,929,474 | B2 | 4/2011 | Pettus et al. |
| 8,014,416 | B2 | 9/2011 | Ho et al. |
| 8,036,629 | B2 | 10/2011 | Tandy |
| 8,041,227 | B2 | 10/2011 | Holcombe et al. |
| 8,063,769 | B2 | 11/2011 | Rofougaran |
| 8,081,699 | B2 | 12/2011 | Siwiak et al. |
| 8,087,939 | B2 | 1/2012 | Rohrbach et al. |
| 8,121,542 | B2 | 2/2012 | Zack et al. |
| 8,183,935 | B2 | 5/2012 | Milano et al. |
| 8,244,179 | B2 | 8/2012 | Dua |
| 8,279,611 | B2 | 10/2012 | Wong et al. |
| 8,339,258 | B2 | 12/2012 | Rofougaran |
| 2002/0008665 | A1 | 1/2002 | Takenoshita |
| 2002/0118083 | A1 | 8/2002 | Pergande |
| 2003/0137371 | A1 | 7/2003 | Saitoh et al. |
| 2004/0214621 | A1 | 10/2004 | Ponce De Leon et al. |
| 2005/0140436 | A1 | 6/2005 | Ichitsubo et al. |
| 2006/0038168 | A1 | 2/2006 | Estes et al. |
| 2006/0139206 | A1 * | 6/2006 | Nagasaku ............... G01S 7/032 342/104 |
| 2006/0159158 | A1 | 7/2006 | Moore et al. |
| 2007/0024504 | A1 | 2/2007 | Matsunaga |
| 2007/0063056 | A1 | 3/2007 | Gaucher et al. |
| 2007/0115164 | A1 * | 5/2007 | Wu ..................... G08B 13/2494 342/28 |
| 2007/0229270 | A1 | 10/2007 | Rofougaran |
| 2007/0278632 | A1 | 12/2007 | Zhao et al. |
| 2008/0089667 | A1 | 4/2008 | Grady et al. |
| 2008/0112101 | A1 | 5/2008 | McElwee et al. |
| 2008/0150799 | A1 | 6/2008 | Hemmi et al. |
| 2008/0150821 | A1 | 6/2008 | Koch et al. |
| 2008/0159243 | A1 | 7/2008 | Rofougaran |
| 2008/0192726 | A1 | 8/2008 | Mahesh et al. |
| 2008/0195788 | A1 | 8/2008 | Tamir et al. |
| 2008/0290959 | A1 | 11/2008 | Ali et al. |
| 2008/0293446 | A1 | 11/2008 | Rofougaran |
| 2009/0006677 | A1 | 1/2009 | Rofougaran |
| 2009/0009337 | A1 | 1/2009 | Rofougaran |
| 2009/0037628 | A1 | 2/2009 | Rofougaran |
| 2009/0075688 | A1 | 3/2009 | Rofougaran |
| 2009/0094506 | A1 | 4/2009 | Lakkis |
| 2009/0096912 | A1 * | 4/2009 | Bloch ..................... G02B 9/04 348/340 |
| 2009/0175323 | A1 | 7/2009 | Chung |
| 2009/0218407 | A1 | 9/2009 | Rofougaran |
| 2009/0218701 | A1 | 9/2009 | Rofougaran |
| 2009/0236701 | A1 | 9/2009 | Sun et al. |
| 2009/0239392 | A1 | 9/2009 | Sumitomo et al. |
| 2009/0239483 | A1 | 9/2009 | Rofougaran |
| 2009/0245808 | A1 | 10/2009 | Rofougaran |
| 2009/0280765 | A1 | 11/2009 | Rofougaran et al. |
| 2010/0127804 | A1 | 5/2010 | Vouloumanos |
| 2010/0159829 | A1 | 6/2010 | McCormack |
| 2010/0202499 | A1 | 8/2010 | Lee et al. |
| 2010/0231452 | A1 | 9/2010 | Babakhani et al. |
| 2010/0254025 | A1 * | 10/2010 | Yoshida .................. G02B 9/60 359/717 |
| 2010/0277394 | A1 | 11/2010 | Haustein et al. |
| 2010/0283700 | A1 * | 11/2010 | Rajanish ................ H01L 23/66 343/793 |
| 2010/0285634 | A1 | 11/2010 | Rofougaran |
| 2010/0297954 | A1 | 11/2010 | Rofougaran et al. |
| 2011/0047588 | A1 | 2/2011 | Takeuchi et al. |
| 2011/0084398 | A1 | 4/2011 | Pilard et al. |
| 2011/0181484 | A1 | 7/2011 | Pettus et al. |
| 2011/0207425 | A1 | 8/2011 | Juntunen et al. |
| 2011/0285606 | A1 | 11/2011 | De Graauw et al. |
| 2011/0286703 | A1 | 11/2011 | Kishima et al. |
| 2011/0311231 | A1 | 12/2011 | Ridgway et al. |
| 2012/0013499 | A1 | 1/2012 | Hayata |
| 2012/0028582 | A1 | 2/2012 | Tandy |
| 2012/0038813 | A1 * | 2/2012 | Jung ..................... H04N 5/2254 348/340 |
| 2012/0064664 | A1 | 3/2012 | Yamazaki et al. |
| 2012/0069772 | A1 | 3/2012 | Byrne et al. |
| 2012/0083137 | A1 | 4/2012 | Rohrbach et al. |
| 2012/0263244 | A1 | 10/2012 | Kyles et al. |
| 2012/0286049 | A1 | 11/2012 | McCormack et al. |
| 2012/0290760 | A1 | 11/2012 | McCormack et al. |
| 2012/0295539 | A1 | 11/2012 | McCormack et al. |
| 2012/0307932 | A1 | 12/2012 | McCormack et al. |
| 2012/0319496 | A1 | 12/2012 | McCormack et al. |
| 2012/0319890 | A1 | 12/2012 | McCormack et al. |
| 2013/0070817 | A1 | 3/2013 | McCormack et al. |
| 2013/0106673 | A1 | 5/2013 | McCormack et al. |
| 2013/0109303 | A1 | 5/2013 | McCormack et al. |
| 2013/0157477 | A1 | 6/2013 | McCormack |
| 2013/0183903 | A1 | 7/2013 | McCormack et al. |

FOREIGN PATENT DOCUMENTS

| | | |
|---|---|---|
| EP | 0884799 A2 | 12/1998 |
| EP | 0896380 A2 | 2/1999 |
| EP | 0996189 A2 | 4/2000 |
| EP | 1041666 A1 | 10/2000 |
| EP | 1 298 809 A2 | 4/2003 |

(56) References Cited

FOREIGN PATENT DOCUMENTS

| | | |
|---|---|---|
| EP | 1357395 A1 | 10/2003 |
| EP | 2 309 608 A1 | 4/2011 |
| EP | 2328226 A1 | 6/2011 |
| EP | 2 360 923 A1 | 8/2011 |
| GB | 2217114 A | 10/1989 |
| JP | 2001326506 A | 11/2001 |
| JP | 2002261514 A | 9/2002 |
| JP | 2002265729 A | 9/2002 |
| JP | 2008252566 A | 10/2008 |
| WO | 2011/114737 A1 | 9/2011 |
| WO | 2011/114738 A1 | 9/2011 |
| WO | 2012/129426 A3 | 9/2012 |
| WO | 2012/155135 A3 | 11/2012 |
| WO | 2012/166922 A1 | 12/2012 |
| WO | 2012/174350 A1 | 12/2012 |
| WO | 2013/006641 A3 | 1/2013 |
| WO | 2013/040396 A1 | 3/2013 |
| WO | 2013/059801 A1 | 4/2013 |
| WO | 2013/059802 A1 | 4/2013 |
| WO | 2013/090625 A1 | 6/2013 |

OTHER PUBLICATIONS

Eric A. Juntunen, "60 GHz CMOS Pico-Joule/Bit Oook Receiver Design for Multi-Gigabit Per Second Wireless Communications" thesis paper, Aug. 2008, 52 pages.
Murcia Martinez, J., Authorized Officer, European Patent Office, "International Search Report" in connection with related Application Serial No. PCT/US2012/040214, dated Aug. 21, 2012, 3 pages.
Murcia Martinez, J., Authorized Officer, European Patent Office, "Written Opinion of the International Searching Authority" in connection with related Application Serial No. PCT/US2012/040214, dated Aug. 21, 2012, 8 pages.
Ablerga, Vito, Authorized Officer, European Patent Office, "International Search Report" in connection with related Application Serial No. PCT/US2012/042616,, dated Oct. 1, 2012, 4 pages.
Ablerga, Vito, Authorized Officer, European Patent Office, "Written Opinion of the International Searching Authority" in connection with related Application Serial No. PCT/US2012/042616,, dated Oct. 1, 2012, 10 pages.
Cortes Rosa, Joao, Authorized Officer, European Patent Office, "International Search Report" in connection with related Application No. PCT/US2012/030166, dated Oct. 31, 2010, 6 pages.
Cortes Rosa, Joao, Authorized Officer, European Patent Office, "Written Opinion of the International Searching Authority" in connection with related Application No. PCT/US2012/030166, dated Oct. 31, 2010, 9 pages.
Helms, Jochen, Authorized Officer, European Patent Office, "International Search Report" in connection with related Application No. PCT/US2012/055488, dated Dec. 13, 2012, 4 pages.
Helms, Jochen, Authorized Officer, European Patent Office, "Written Opinion of the International Searching Authority" in connection with related Application No. PCT/US2012/055488, dated Dec. 13, 2012, 8 pages.
Helms, Jochen, Authorized Officer, European Patent Office, "International Search Report" in connection with related Application No. PCT/US2012/045444, dated Jan. 21, 2013, 7 pages.
Helms, Jochen, Authorized Officer, European Patent Office, "Written Opinion of the International Searching Authority" in connection with related Application No. PCT/US2012/045444, dated Jan. 21, 2013, 9 pages.
Helms, Jochen, Authorized Officer, European Patent Office, "International Search Report" in connection with related Application No. PCT/US2012/037795, dated Jan. 21, 2013, 7 pages.
Helms, Jochen, Authorized Officer, European Patent Office, "Written Opinion of the International Searching Authority" in connection with related Application No. PCT/US2012/037795, dated Jan. 21, 2013, 12 pages.
Helms, Jochen, Authorized Officer, European Patent Office, "International Search Report" in connection with related Application No. PCT/US2012/061345, dated Jan. 24, 2013, 4 pages.
Helms, Jochen, Authorized Officer, European Patent Office, "Written Opinion of the International Searching Authority" in connection with related Application No. PCT/US2012/061345, dated Jan. 24, 2013, 7 pages.
Franz, Volker, Authorized Officer, European Patent Office, "International Search Report" in connection with related Application No. PCT/US2012/061346, dated Jan. 24, 2013, 5 pages.
Franz, Volker, Authorized Officer, European Patent Office, "Witten Opinion of the International Searching Authority" in connection with related Application No. PCT/US2012/061346, dated Jan. 24, 2013, 9 pages.
Bouhana, Emmanuel, Authorized Officer, European Patent Office, "International Search Report" in connection with related Application No. PCT/US2012/069576, dated May 2, 2013, 3 pages.
Bouhana, Emmanuel, Authorized Officer, European Patent Office, "Written Opinion of the International Searching Authority" in connection with related Application No. PCT/US2012/069576, dated May 2, 2013, 13 pages.
Office of Engineering and Technology Federal Communications Commission, "Understanding the FCC Regulations for Low-Power, Non-Licensed Transmitters", OET Bulletin No. 63, Oct. 1993, 34 pages.
Vahle Electrification Systems, "CPS Contactless Power System", Catalog No. 9d/E, 2004, 12 pages.
Future Technology Devices International Limited (FTDI), "Technical Note TN_113 Simplified Description of USB Device Enumeration", Doc. Ref. No. FT_000180, Version 1.0, dated Oct. 28, 2009, 19 pages.
Lee W. Young, Authorized Officer, U.S. Patent and Trademark Office, "International Search Report" in connection with related PCT Patent App. No. PCT/US2013/027835, dated May 3, 2013, 4 pages.
Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.
Márquez, T. López, Authorized Officer, European Patent Office, "International Search Report" in connection with related PCT Patent App. No. PCT/US2013/029469, dated Jun. 6, 2013, 5 pages.
Márquez, T. López, Authorized Officer, European Patent Office, "Written Opinion of the International Searching Authority" in connection with related PCT Patent App. No. PCT/US2013/029469, dated Jun. 6, 2013, 5 pages.
Jochen Helms, Authorized Officer, European Patent Office, "International Search Report" in connection with related PCT Patent App. No. PCT/US2013/023665, dated Jun. 20, 2013, 5 pages.
Jochen Helms, Authorized Officer, European Patent Office, "Written Opinion of the International Searching Authority" in connection with related PCT Patent App. No. PCT/US2013/023665, dated Jun. 20, 2013, 10 pages.
J Marot-Lassauzaie, Authorized Officer, European Patent Office, "International Search Report" in connection with related PCT Patent Application No. PCT/US2013/037012, dated Aug. 7, 2013, 6 pages.
J Marot-Lassauzaie, Authorized Officer, European Patent Office, "Written Opinion of the International Searching Authority" in connection with related PCT Patent Application No. PCT/US2013/037012, dated Aug. 7, 2013, 7 pages.
Chinese Second Office Action, Chinese Application No. 2013800268841, dated Apr. 19, 2016, 20 pages.
Chinese Third Office Action, Chinese Application No. 2013800268841, dated Nov. 8, 2016, 20 pages.
Chinese Fourth Office Action, Chinese Application No. 201380026884.1, dated Jun. 5, 2017, 17 pages.
Chinese Rejection Decision, Chinese Application No. 201380026884.1, dated Oct. 26, 2017, 16 pages.

\* cited by examiner

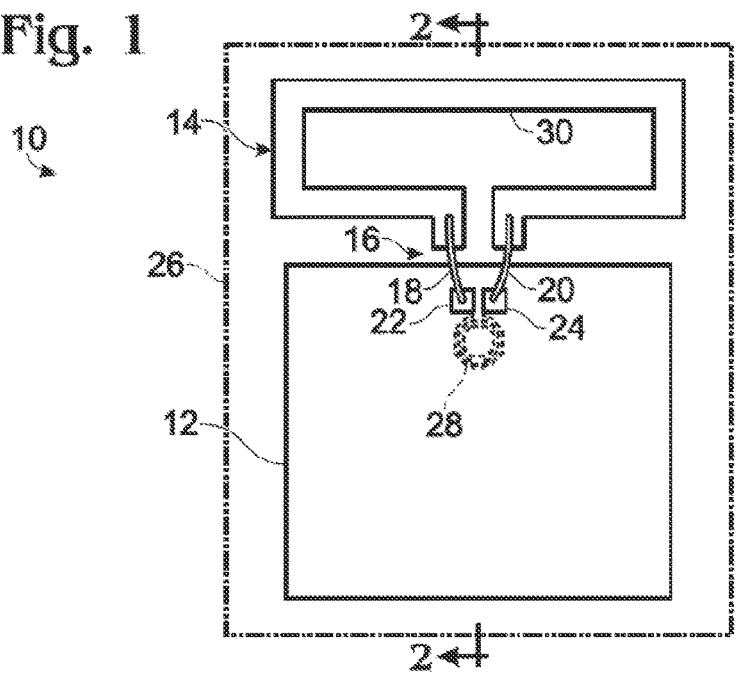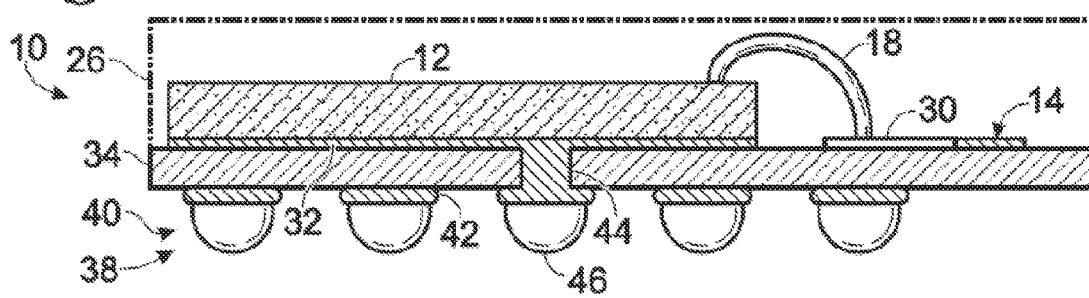

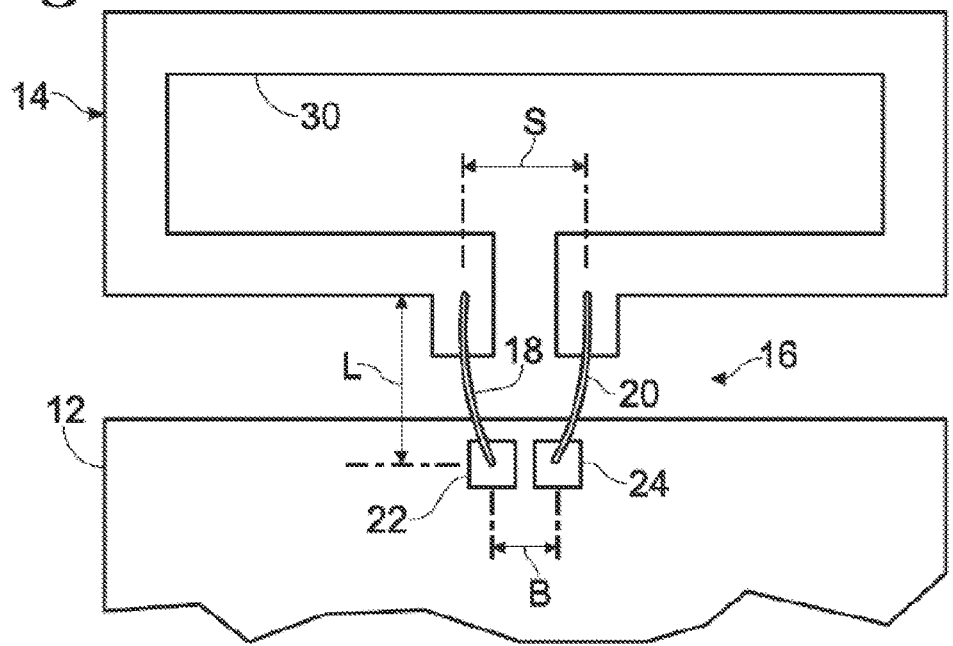
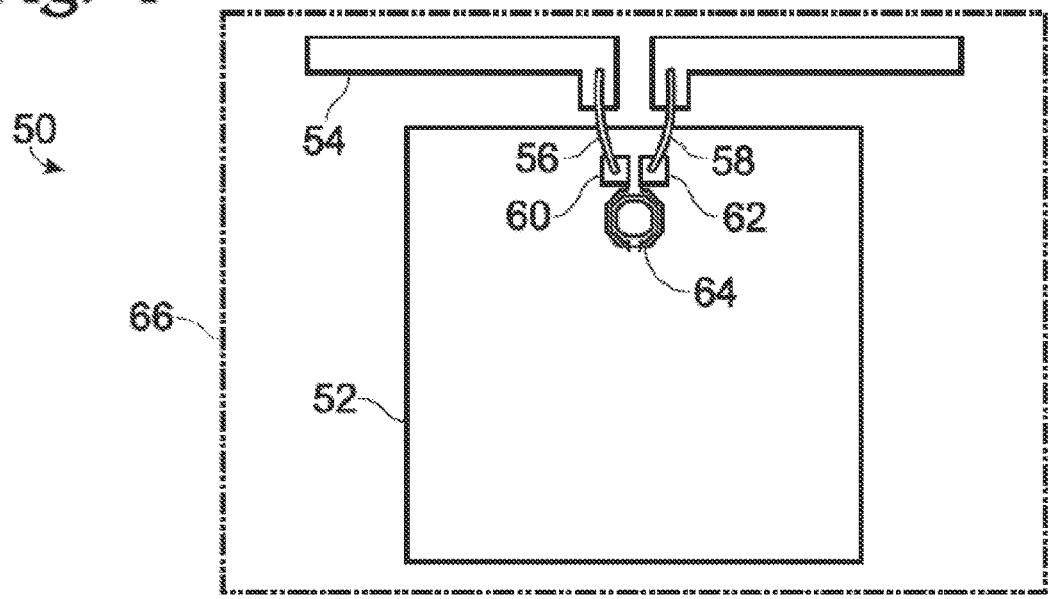

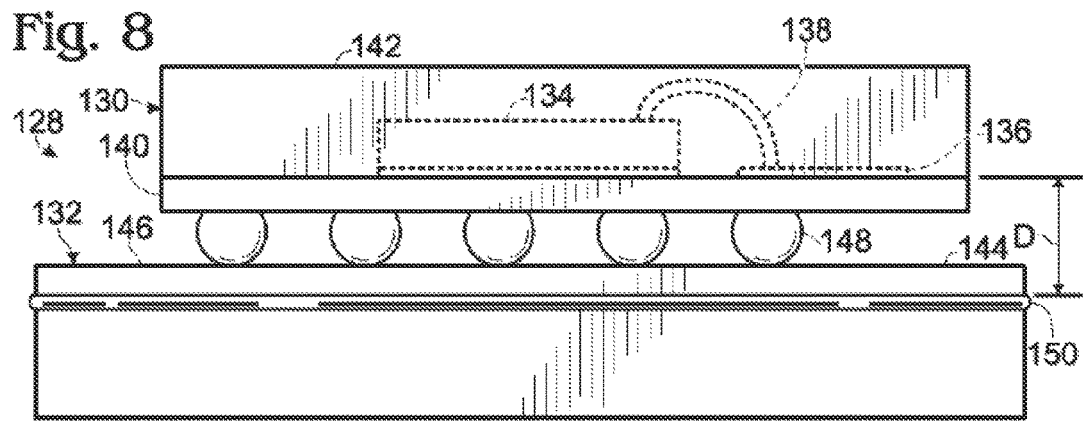
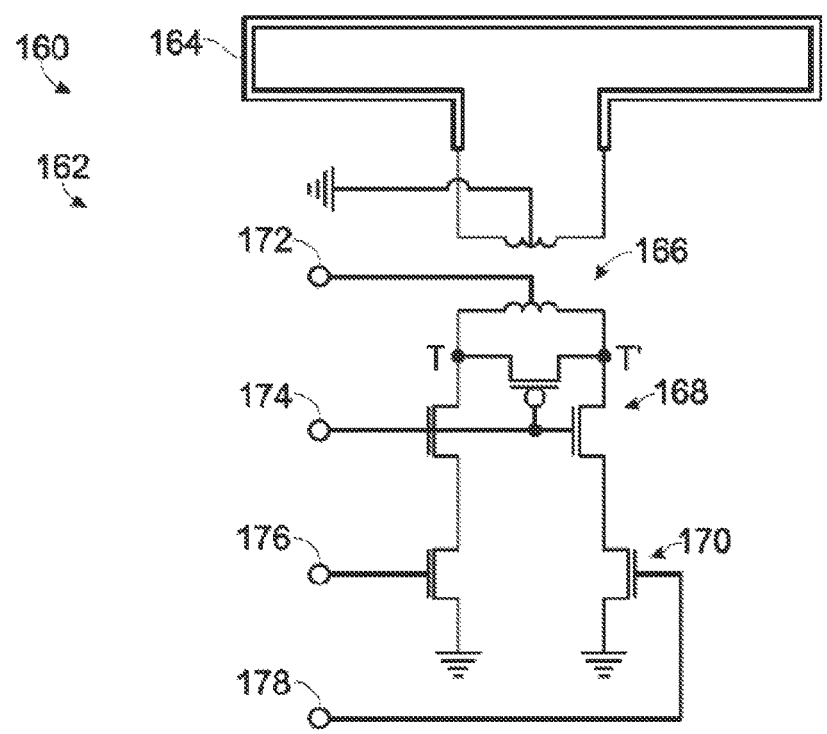

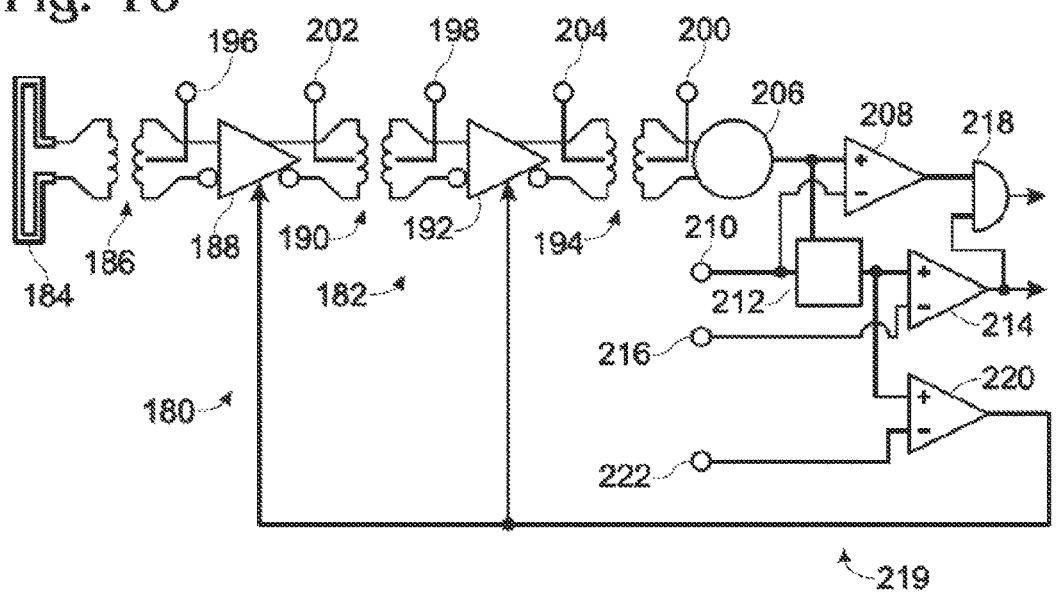
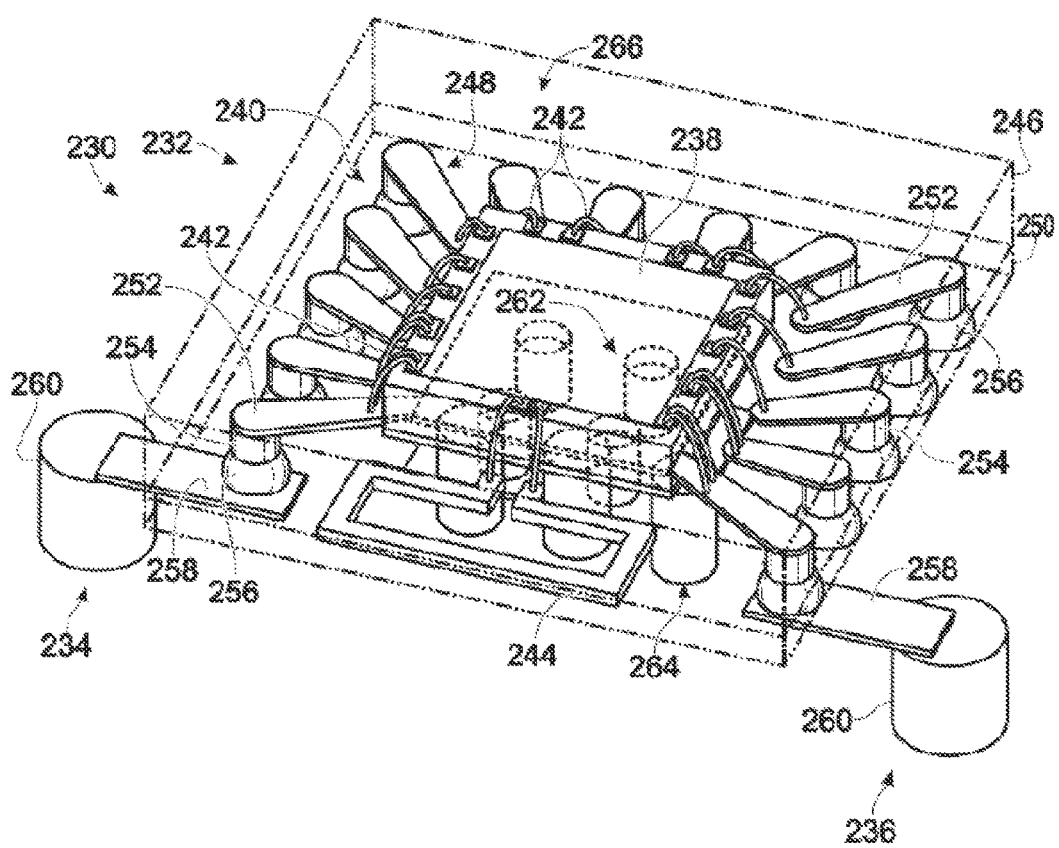

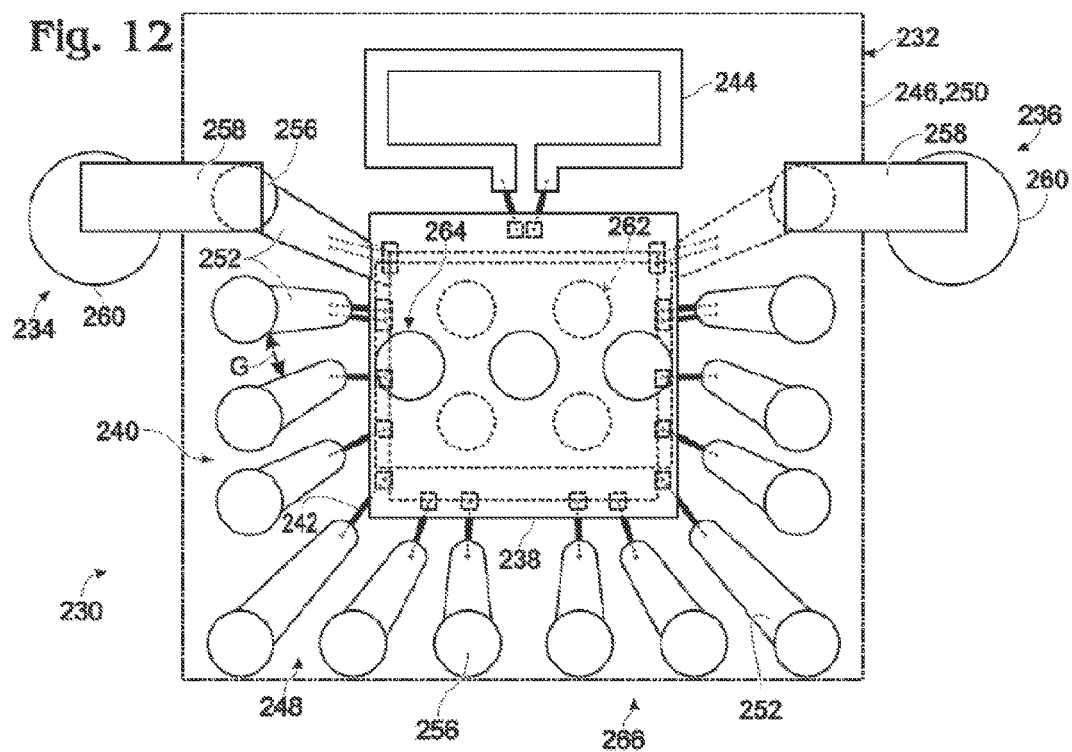

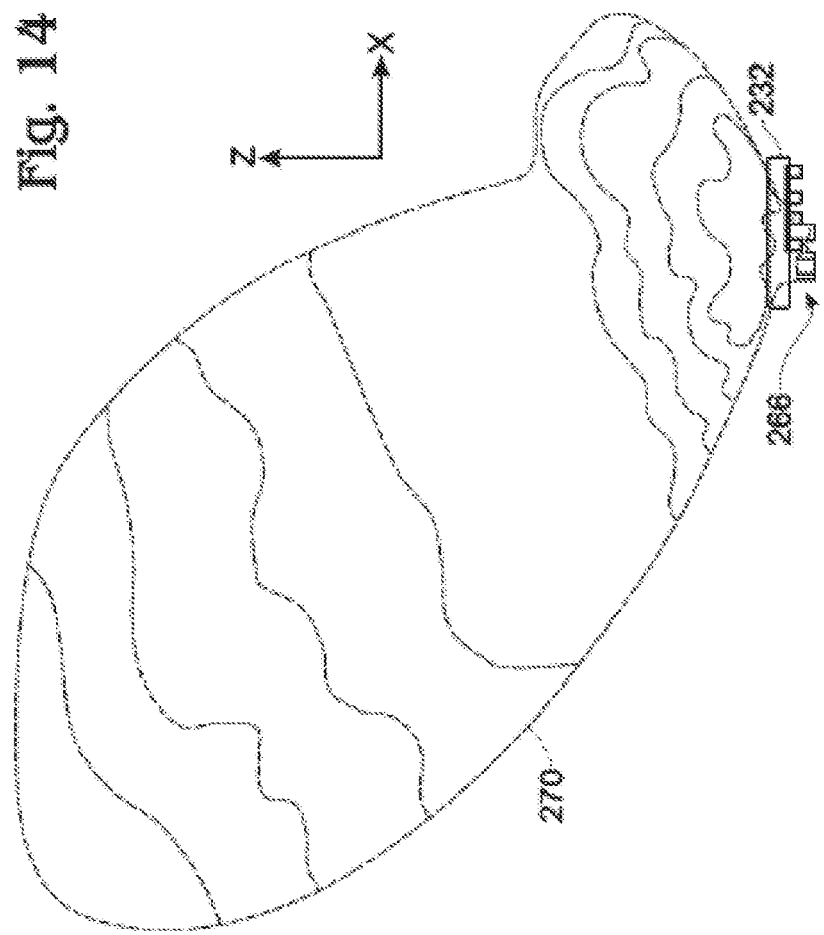
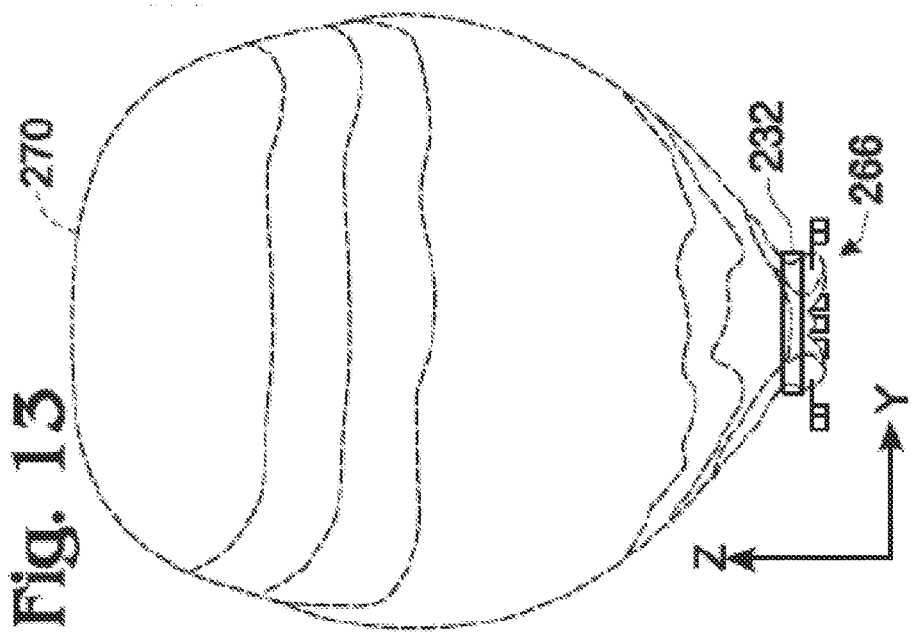

Fig. 21
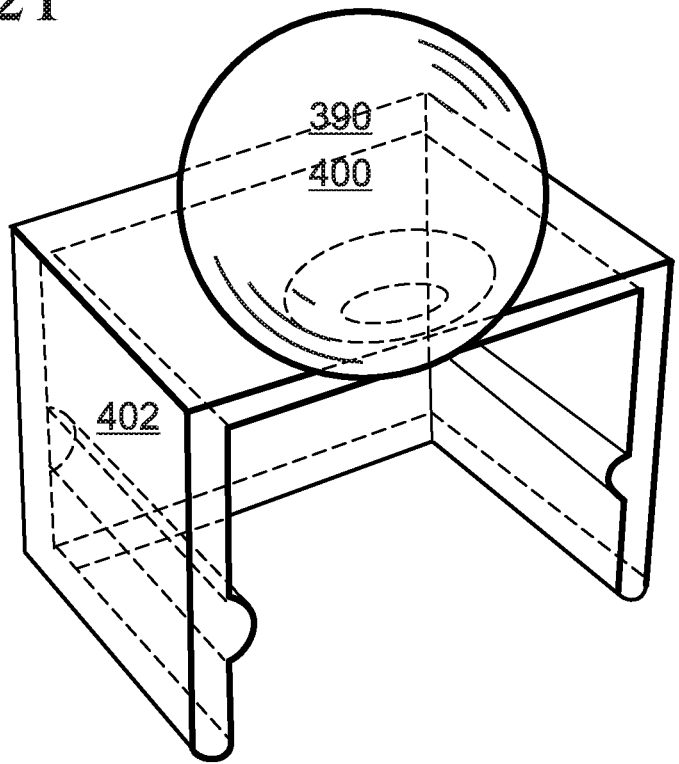
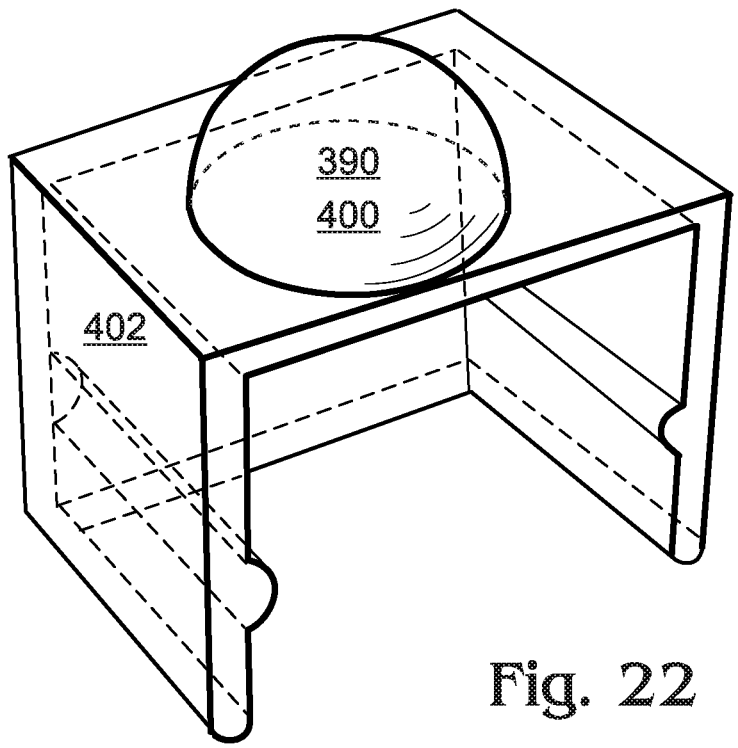
Fig. 22

Fig. 27
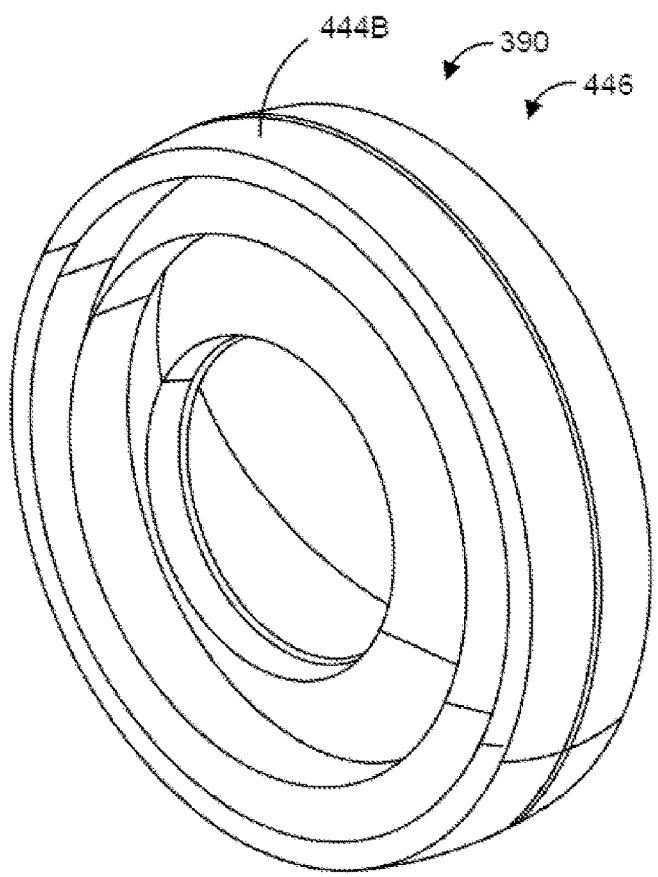
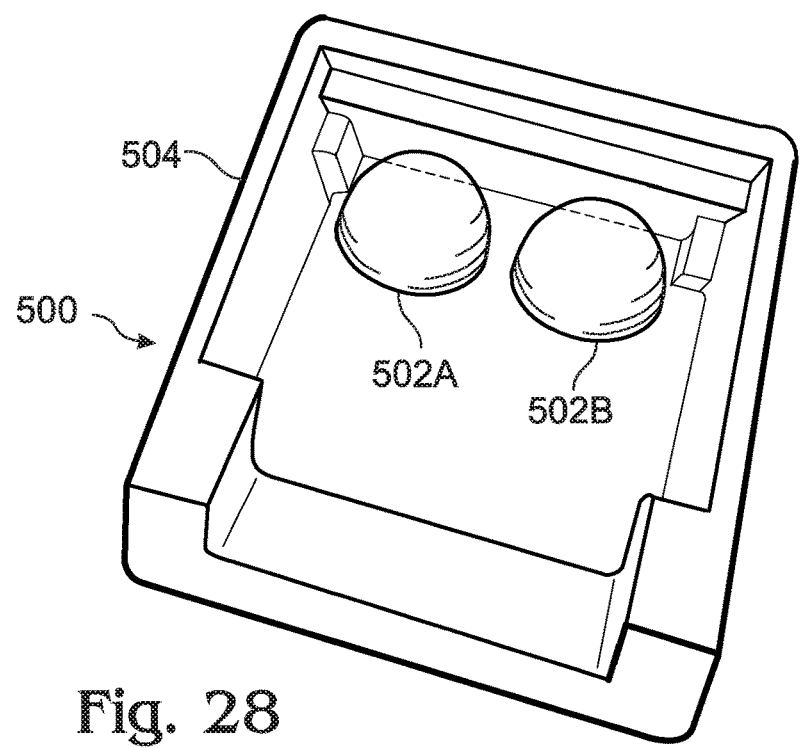
Fig. 28

DIELECTRIC LENS STRUCTURES FOR EHF RADIATION

CROSS-REFERENCE TO RELATED APPLICATIONS

This application claims the benefit of U.S. Provisional Patent Application No. 61/625,575 filed Apr. 17, 2012, which application is incorporated herein by reference for all purposes.

FIELD OF THE DISCLOSURE

This disclosure relates to systems and methods related to focusing and dispersing of electromagnetic signals, specifically EHF radiation.

BACKGROUND OF THE DISCLOSURE

Advances in semiconductor manufacturing and circuit design technologies have enabled the development and production of ICs with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic system with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

These characteristics of conventional connectors can lead to degradation of signal integrity and instability of electronic systems needing to transfer data at very high rates, which in turn limits the utility of such products.

SUMMARY OF THE DISCLOSURE

An embodiment of the present disclosure may provide a communication device for communicating using EHF electromagnetic radiation. The communication device may include an integrated circuit (IC) package including a transducer which may be configured to transmit and/or receive an EHF electromagnetic signal and convert between electrical signals and electromagnetic signals. The integrated circuit package may also include an integrated circuit including at least one of a transmitter circuit and a received circuit that is operatively coupled to the transducer. Further, the IC package may include an insulating material in which each of the integrated circuit and the transducer are at least partly embedded, such that the insulating material may maintain each of the transducer and the IC in a fixed location relative to the other. The communication device may include a dielectric lens configured to refract incident EHF electromagnetic radiation. The dielectric lens is disposed so as to enhance transmission or reception of the EHF electromagnetic signal by the transducer.

Another embodiment of the present disclosure provides an EHF communication system including a first device including a first integrated circuit package having a first transducer. The first device may be configured to transmit an electromagnetic signal in the EHF frequency range. The first device may also include a first dielectric lens disposed adjacent the first transducer such that at least a portion of the electromagnetic signal is refracted by the first dielectric lens. The EHF communication system may also include a second device including a second integrated circuit package having a second transducer and may be configured to receive the electromagnetic signal refracted by the first dielectric lens.

BRIEF DESCRIPTION OF THE DRAWINGS

Having thus described the invention in general terms, reference will now be made to the accompanying drawings, which are not necessarily drawn to scale, and wherein:

FIG. 1 shows a simplified schematic overhead view of a first example of an Integrated circuit (IC) package including a die and antenna according to an embodiment of the present disclosure.

FIG. 2 shows a cross-section of the IC package of FIG. 1 taken along line 2-2.

FIG. 3 is an enlarged view of an interconnection of the die and antenna of FIGS. 1 and 2.

FIG. 4 shows a schematic overhead view of a second example of an IC package including a die and antenna.

Figure 5:
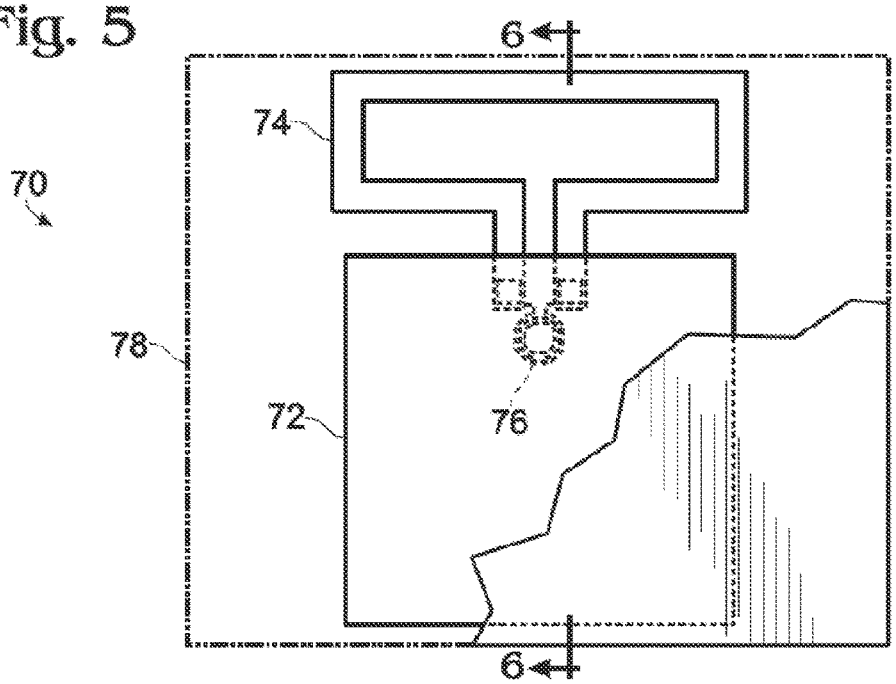

FIG. 5 shows a schematic overhead view of a third example of an IC package including a die and antenna.

Figure 6:
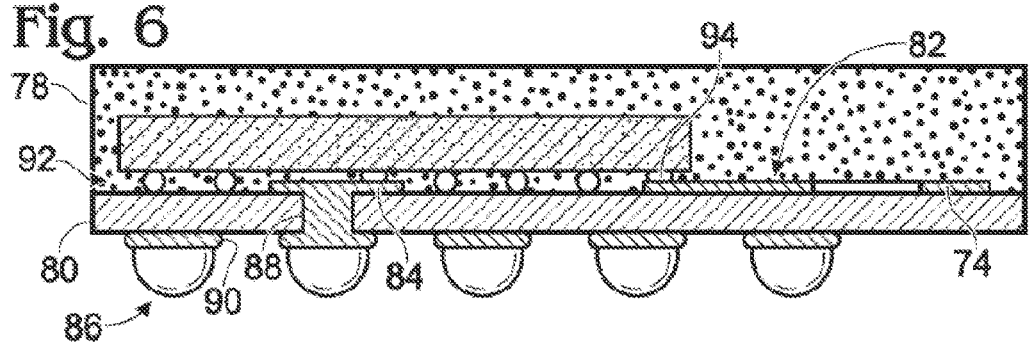

FIG. 6 shows a cross-section of the IC package of FIG. 5 taken along line 6-6.

Figure 7:
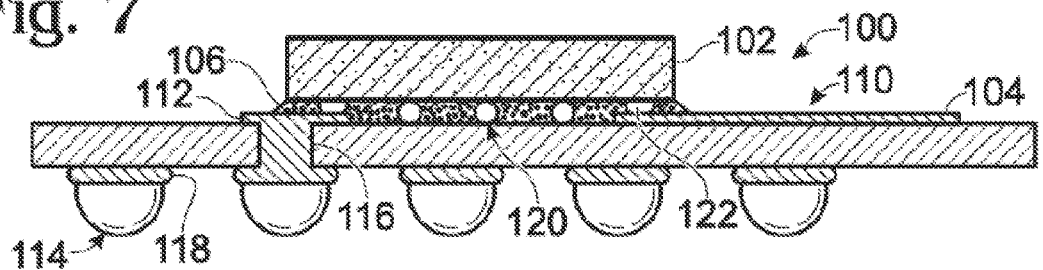

FIG. 7 shows another embodiment of an IC package.

FIG. 8 shows a schematic side view of an exemplary communication device including an IC package and printed circuit board (PCB).

FIG. 9 is a simplified circuit diagram showing portions of an exemplary transmitter circuit and antenna.

FIG. 10 is a circuit diagram showing portions of an exemplary receiver circuit and antenna.

FIG. 11 shows an isometric view of another exemplary communication device including an IC package with external circuit conductors.

FIG. 12 shows a bottom view of the exemplary communication device of FIG. 11.

FIGS. 13 and 14 illustrate a representative radiation pattern resulting from the communication device of FIG. 11 configured as a transmitter.

Figure 15:
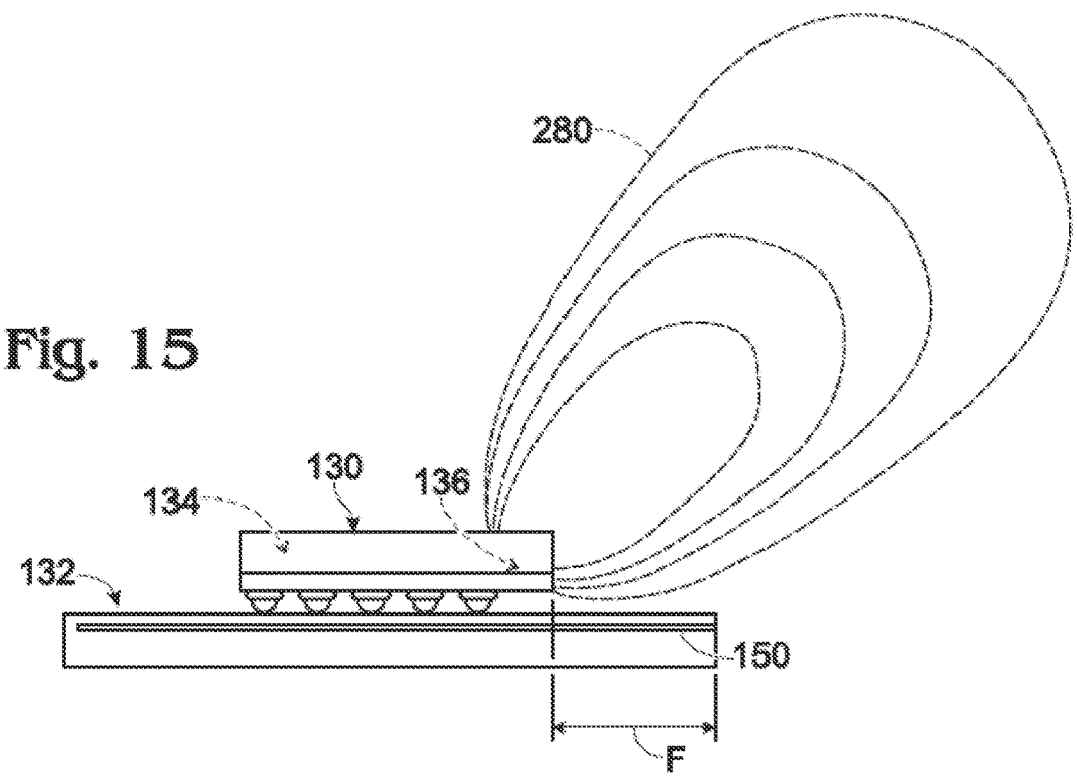

FIG. 15 shows a transmitting device with an exemplary configuration of a PCB ground plane and stylized representation of a resulting radiation pattern.

Figure 16:
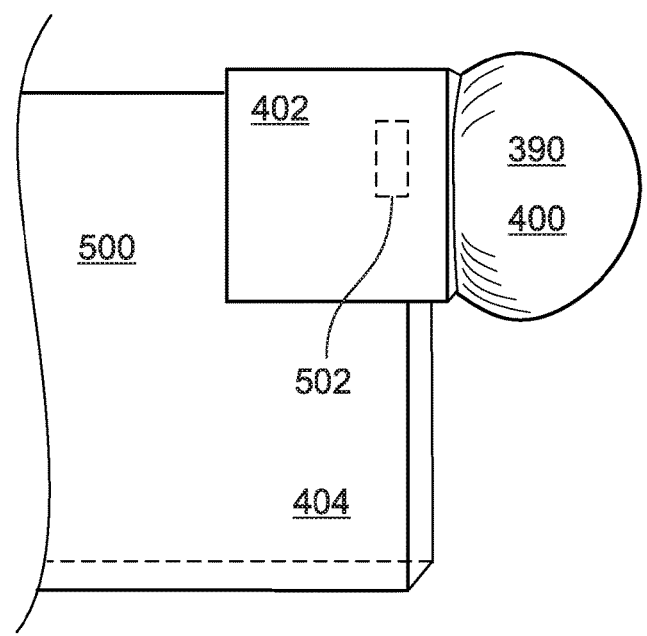

FIG. 16 shows a communication device with an exemplary dielectric lens.

Figure 17:
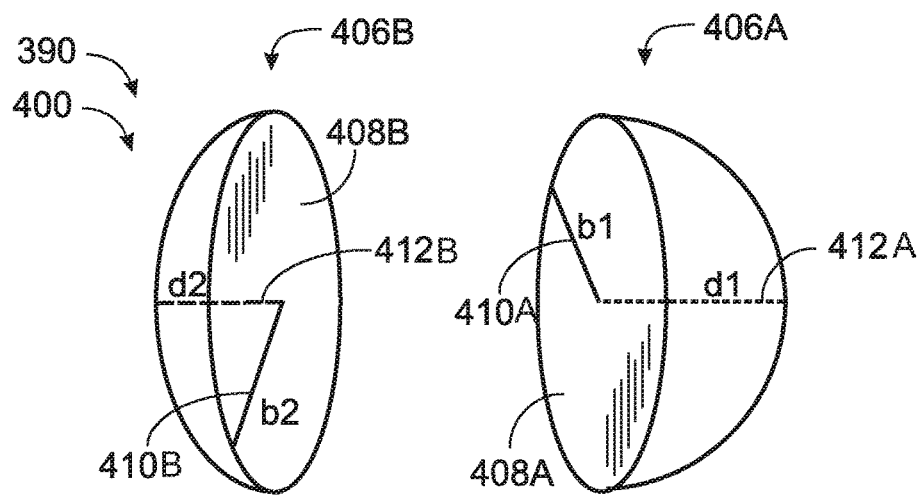

FIG. 17 is a diagram of two portions of an exemplary dielectric lens.

Figure 18:
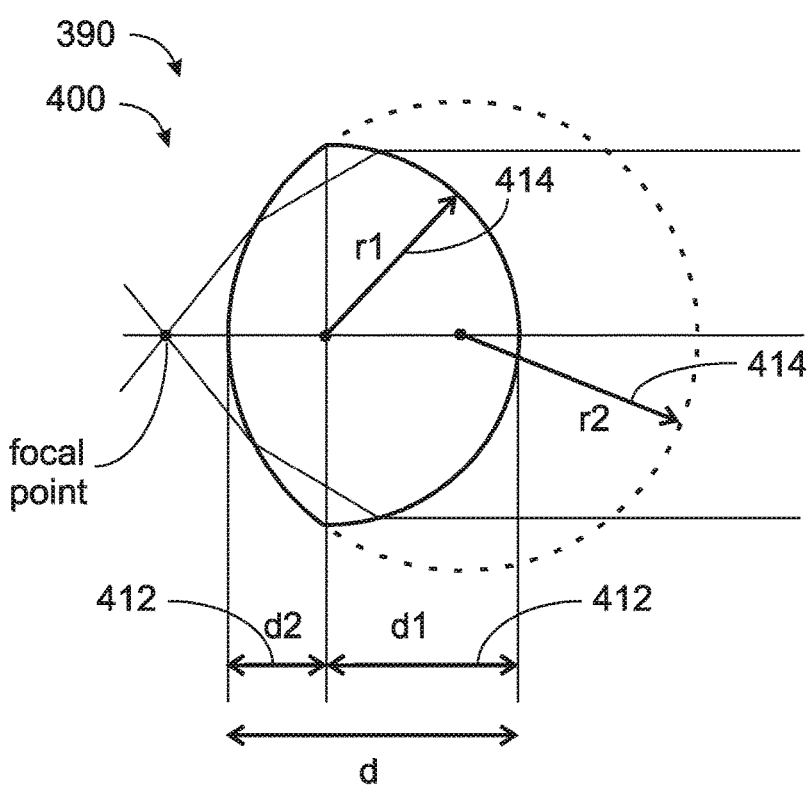
Figure 19:
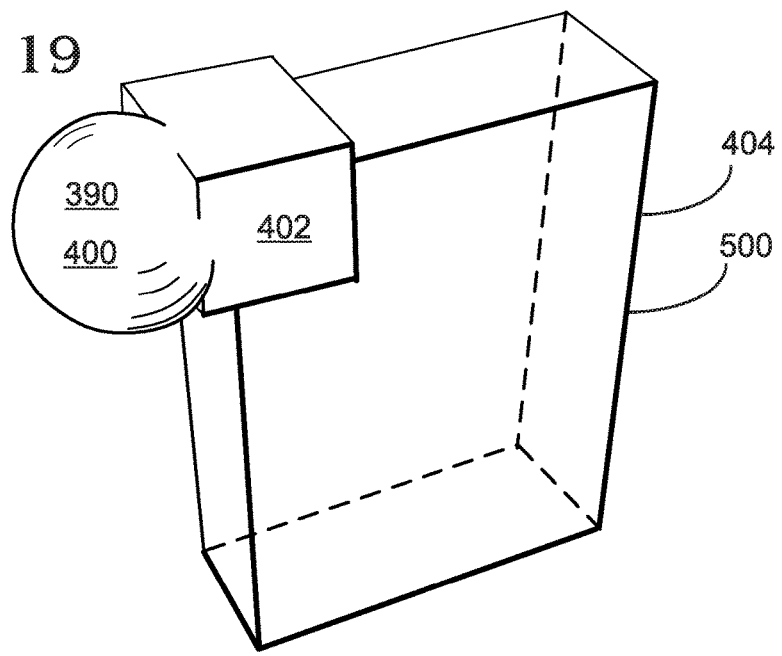
Figure 20:
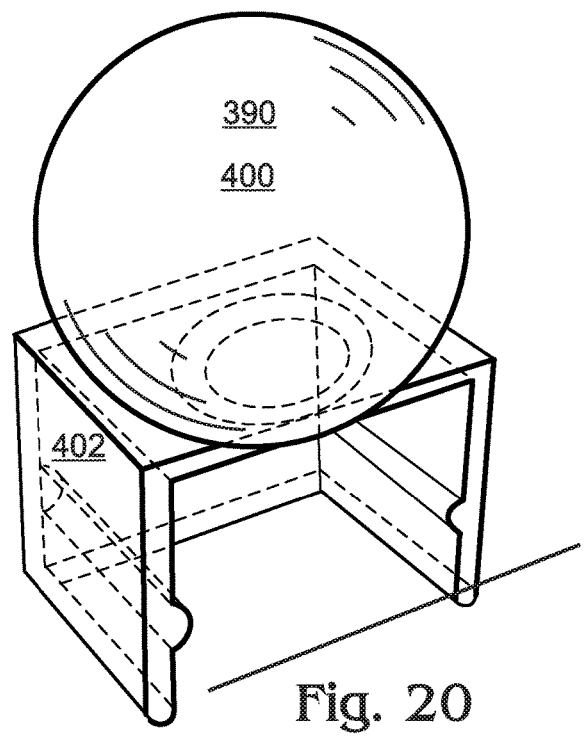

FIG. 18 is a cross-sectional diagram of an exemplary dielectric lens.

FIGS. 19-22 are photographs of various exemplary dielectric lenses.

Figure 23:
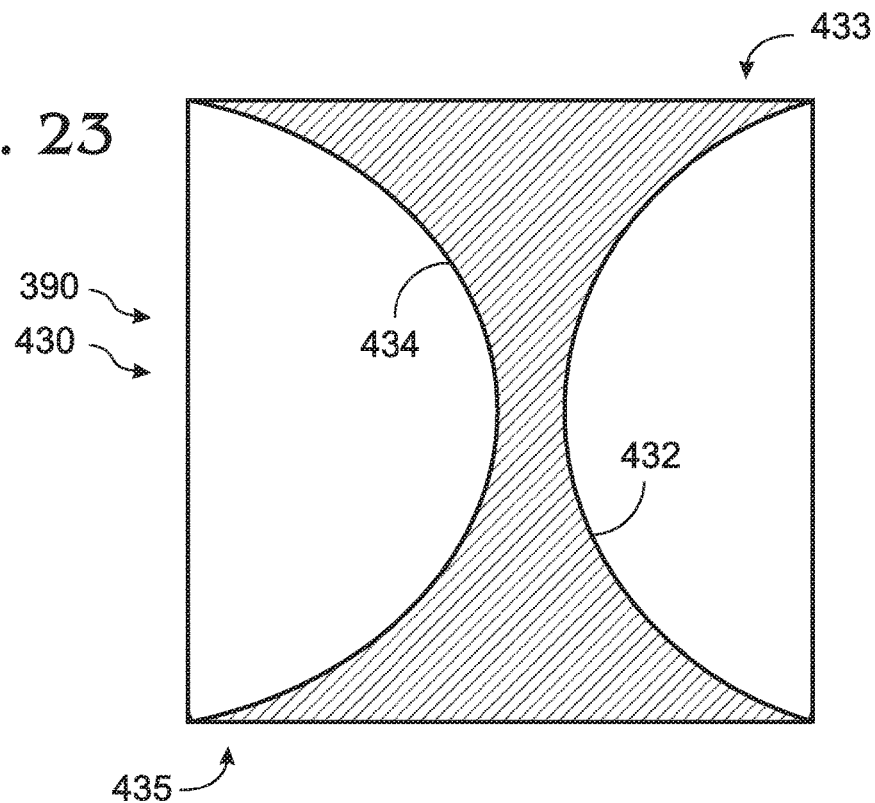

FIG. 23 is a cross sectional diagram of an exemplary biconcave dielectric lens.

Figure 24:
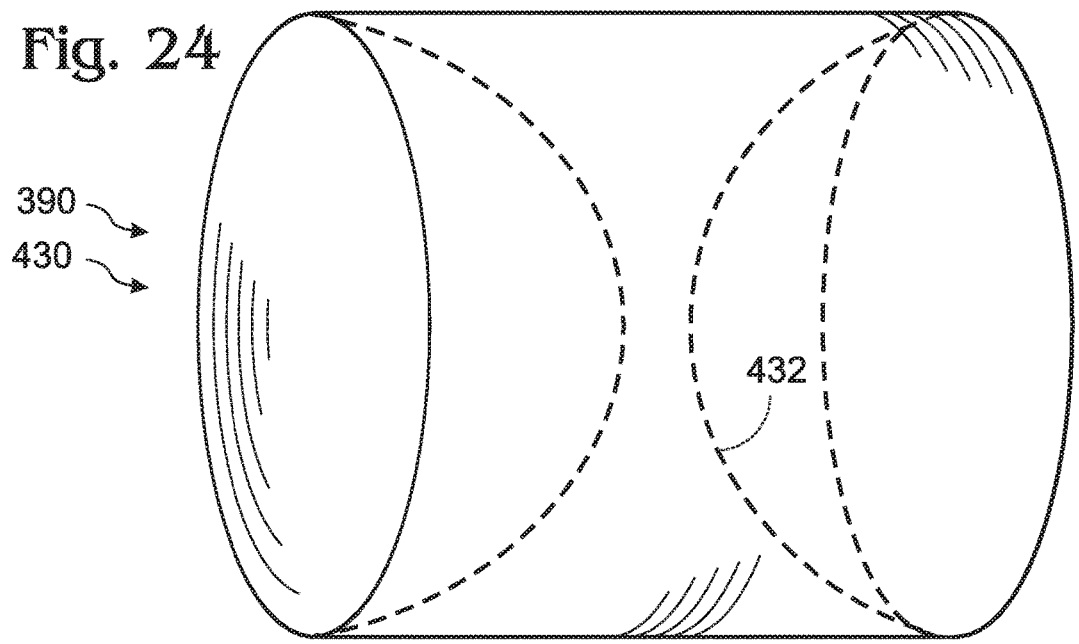

FIG. 24 is an isometric semitransparent view of the lens of FIG. 23.

Figure 25:
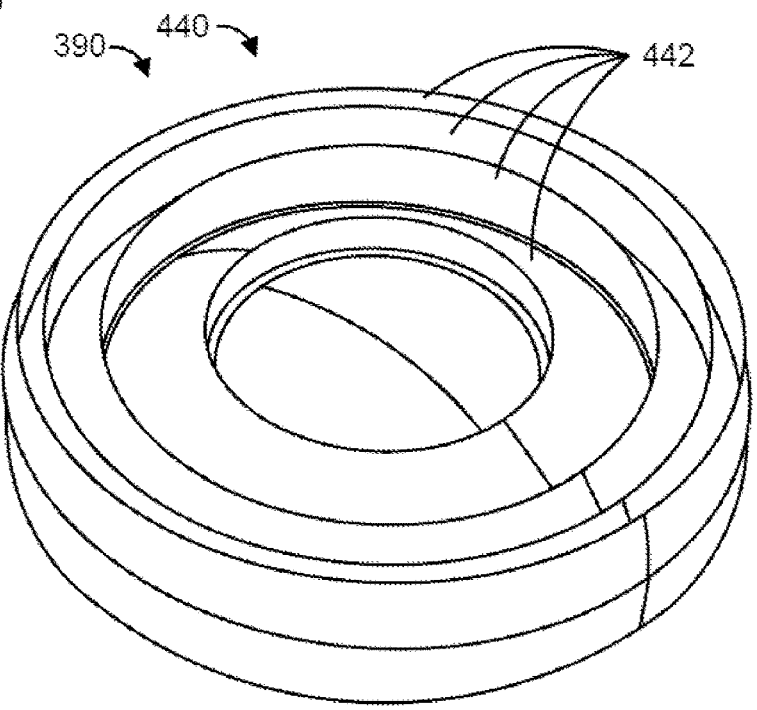

FIG. 25 is an isometric view of an exemplary Fresnel dielectric lens.

Figure 26:
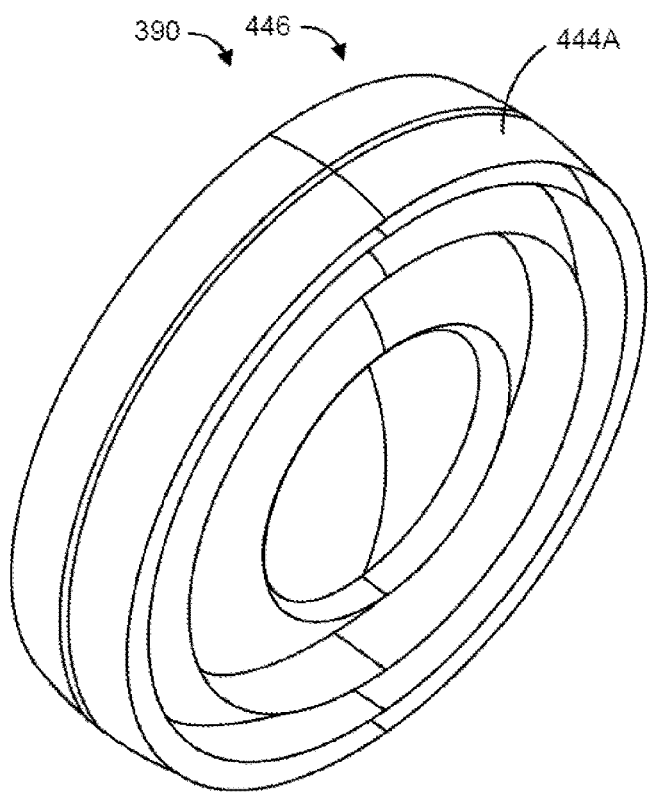

FIG. 26 is an isometric view of another exemplary Fresnel dielectric lens.

FIG. 27 is an isometric view of the other side of the lens of FIG. 26.

FIG. 28 shows yet another exemplary dielectric lens structure.

Figure 29:
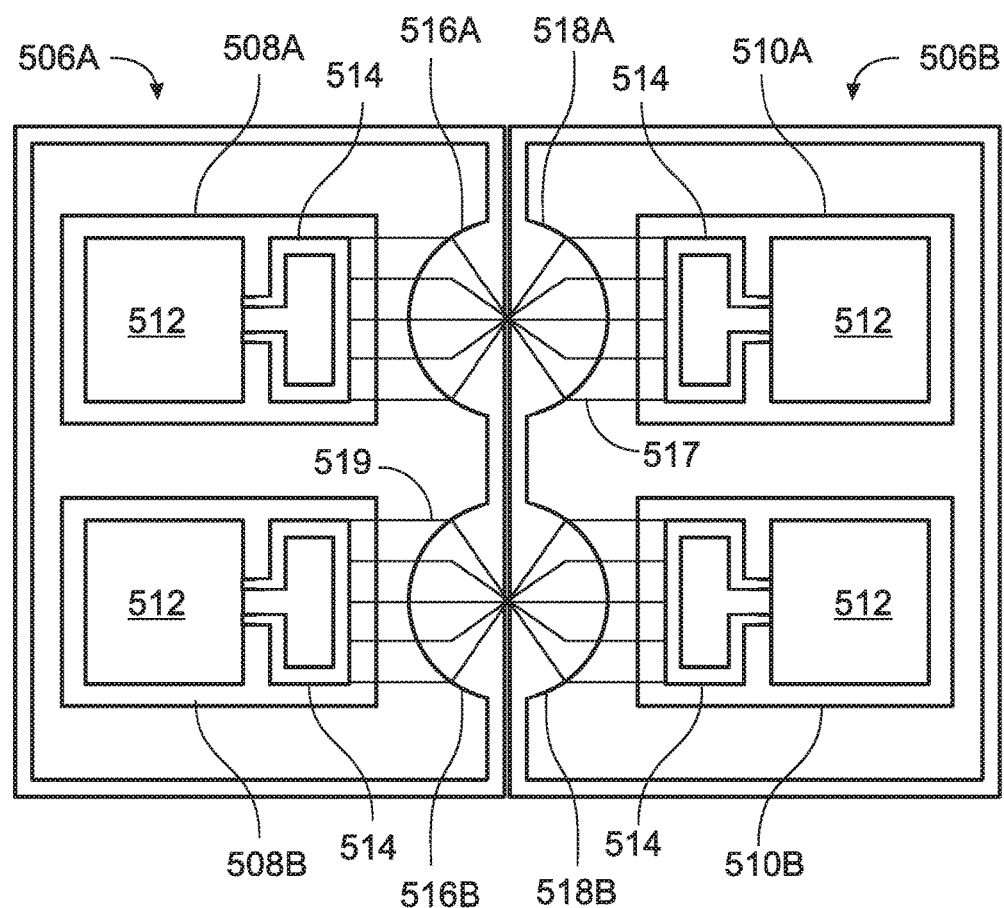

FIG. 29 is a schematic cross-sectional view of a pair of housings for integrated circuit packages, where the housings incorporate exemplary dielectric lenses that enhance EHF communication between integrated circuit packages.

DETAILED DESCRIPTION OF THE DISCLOSURE

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may be discontiguous with respect to each other. In exemplary versions, the transmitter and receiver may be disposed on separate circuit carriers positioned with the antennas of the transmitter/receiver pair in close proximity.

As discussed below, a transmitter or receiver may be configured as an IC package, in which an antenna may be positioned adjacent to a die and held in place by a dielectric or insulating encapsulation or bond material. A transmitter or receiver may be configured as an IC package, in which an antenna may be positioned adjacent to a die and held in place by encapsulation material of the package and/or a lead frame substrate. Examples of EHF antennas embedded in IC packages are shown in the figures and described below.

The presently disclosed subject matter provides a communication device for communication using EHF electromagnetic radiation. The communication device may include an integrated circuit package including a transducer for receiving EHF electromagnetic signals and an integrated circuit (IC) including a transmitter circuit and/or a receiver circuit coupled to the transducer. The transducer and/or the IC may remain partly embedded in an insulating material such that the transducer and the IC are in a fixed location relative to each other. The communication device may also include a dielectric lens that can refract incident EHF electromagnetic radiation. The dielectric lens may be disposed so as to enhance transmission and/or reception of the EHF electromagnetic signal by the transducer. The IC and its components are described in detail with reference to FIGS. 1-3.

FIGS. 1 through 3 show an exemplary first IC package 10, in accordance with an embodiment of the present disclosure. FIG. 1 shows a simplified schematic top view of the first integrated circuit (IC) package including a die 12 and antenna 30 according to an embodiment of the present disclosure. As shown, the IC package 10 may include the die 12, the transducer 14 providing conversion between electrical and electromagnetic (EM) signals, and one or more conductive connectors 16, such as bond wires 18-20. The IC package 10 may include a transmitter circuit and/or a receiver circuit that may operatively couple to the transducer. Further, the conductive connectors 16 or the bond wires 18-20 may electrically connect the transducer 14 to bond pads 22-24 connected to the transmitter and/or the receiver circuit included in the die 12, respectively. The IC package 10 may further include an encapsulating material 26 formed around at least a portion of the die 12 and/or the transducer 14. In this example encapsulating material 26 covers die 12, conductive connectors 16, and transducer 14, and is shown in phantom lines so that details of the die 12 and transducer 14 may be illustrated in solid lines. Alternatively, the encapsulating material may be an insulating material in which each of the IC package 10 and the transducer 14 may remain partially embedded such that the insulating material maintains each of the transducer 14 and the integrated circuit package 10 in a fixed location relative to the other.

The die 12 may include any suitable structure configured as a miniaturized circuit on a suitable die substrate, and is functionally equivalent to a component also referred to as a "chip" or an "integrated circuit (IC)." A die substrate may be any suitable semiconductor material; such as, but not limited to, silicon. The die 12 may be mounted with further electrical conductors 16, such as a lead frame (not shown) for providing connection to external circuits. An impedance transformer 28, shown in dashed lines, may provide impedance matching between the circuit on the die 12 and the transducer 14.

The transducer 14 may be in the form of a folded dipole or loop antenna 30, and may be configured to operate at radio frequencies, such as in the EHF spectrum, and may be configured to transmit and/or receive electromagnetic signals. The antenna 30 may be separate from the die 12 but may remain operatively connected to the die 12 by any suitable conductors 16, and may be located adjacent to the die 12.

The dimensions of the antenna 30 may be suitable for operation in the EHF band of the electromagnetic frequency spectrum. In one example, a loop configuration of the antenna 30 may include a 0.1 mm band of material, laid out in a loop 1.4 mm long and 0.53 mm wide, with a gap of 0.1 mm at the mouth of the loop, and with the edge of the loop approximately 0.2 mm from the edge of die 12.

The encapsulating material 26 may be used to assist in holding the various components of the IC package 10 in fixed relative positions. The encapsulating material 26 may be any suitable material configured to provide electrical insulation and physical protection for the electrical and electronic components of the IC package 10. For example, the encapsulating material 26, also referred to as insulating material, may be a mold compound, glass, plastic, or ceramic. The encapsulating material 26 may be formed in any suitable shape. For example, the encapsulating material 26 may be in the form of a rectangular block, encapsulating all the components of the IC package 10 except the unconnected ends of the conductors 16 connecting the die 12 to external circuits. The external connections may be formed with other circuits or components.

FIG. 2 shows a cross-section of the IC package taken along a line 2-2. As shown, the IC package 10 may further include a ground plane 32 mounted to the lower surface of the die 12 and a package dielectric substrate 34 that may be similar to a dielectric used for PCBs. The ground plane 32 may be any suitable structure configured to provide an electrical ground for the die 12. For example, package ground plane 32 may be a conductive, rectangular, planar structure mounted directly below the die 12 on the substrate 34. The substrate 34 may have two-sided metallization patterns, such as a metallization pattern 36 on the top surface that includes the antenna 30, the ground plane 32, and conductors connected to the die 12 by a suitable set of conductors 16, such as may be provided by a lead frame or flip-chip bumps as discussed further below. The IC package 10 may further include external conductors 38 that may connect the IC package 10 to external circuits, such as are represented by flip-chip solder balls or bumps 40. The bumps 40 may be connected to conductors in metallization pattern 36 by ball pads 42 and vias, such as via 44 connecting a bump 46 to ground plane 32. Various configurations of the IC package 10 will now be described with references to FIGS. 4 through 6.

FIG. 3 is an enlarged view of an interconnection of the die 12 and the antenna 30 of FIGS. 1 and 2. As shown, in an exemplary configuration the transducer 14 may be connected to the die 12 by the bond wires 18 and 20 and the bond pads 22 and 24. The bond wires 18-20 and bond pads 22-24 may be configured to limit impedance mismatch between the transducer 14 and a circuit of the die 12. In one exemplary embodiment, the bond wires 18-20 may be 0.6 mm long, with an overhead measurement (indicated as dimension "L") of approximately 0.3 mm. The bond pads 22-24 may be approximately 0.066 mm square. The bond wires 18-20 may also be disposed such that they are approximately 0.074 mm apart at a point of attachment to the respective bond pads 22-24 (indicated as dimension "B") and approximately 0.2 mm apart at a point of attachment to antenna 30 (indicated as dimension "S"). Impedance matching may be further facilitated by use of transformer 28 shown in FIG. 1.

FIG. 4 depicts a schematic overhead view of a second example of an IC package 50 including a die 52 and antenna 54. As shown, the IC package 50 may have the die 52, the antenna 54, one or more bond wires 56-58, one or more bond pads 60-62, an impedance transformer 64, and an encapsulating material 66, similar to the IC package 10. However, in this example, the antenna 54 is a dipole antenna.

FIGS. 5 and 6 illustrate an exemplary IC package 70 having a die 72, a folded dipole antenna 74, an impedance transformer 76, and an encapsulating material 78, a package dielectric substrate 80, a metallization pattern 82 including antenna 74, and a ground plane 84, one or more package bumps 86, via 88, and one or more ball pads 90 also similar to the IC package 10 of FIG. 1. The encapsulating material 78 may cover the die 72 and the antenna 74. However, in this example, the die 12 may be mounted on a metallization pattern 82 in a flip chip configuration by flip-chip bumps 92. In particular, the flip chip bumps, such as, a bump 94 may connect conductors extending from the antenna 74 to corresponding conductor terminals on the underside of the die 72, without the use of bond wires. FIG. 6 shows a cross-section of the IC package 70 taken along line 6-6.

FIG. 7 depicts an IC package 100, in accordance with an alternate embodiment of the present disclosure. The IC package 100 may include a die 102, a folded dipole antenna 104, an encapsulating material 106, a package dielectric substrate 108, a metallization pattern 110 including an antenna 104, and a ground plane 112, one or more package bumps 114, via 116, one or more ball pads 118, and flip-chip bumps 120, similar to the IC package 70 as discussed with reference to FIG. 5. The flip-chip bumps 120 may include flip-chip bump 122 that can connect conductors extending from the antenna 104 to corresponding conductor terminals on the underside of the die 102, which may be flip-mounted to substrate 108. In this example, the encapsulating material 106 may be used primarily as an under fill between the die 102 and the substrate 108.

It will be appreciated from the above, that a system for transmitting or receiving signals may include a transducer configured to convert between electrical signals and electromagnetic signals; an integrated circuit (IC) operatively coupled to the transducer, the IC containing at least one of a transmitter circuit that transforms a baseband signal into a radio-frequency signal and conducts the radio-frequency electrical signal to the transducer for transmission as an electromagnetic signal and a receiver circuit that receives from the transducer a radio-frequency electrical signal received as an electromagnetic signal by the transducer and transforms the electromagnetic signal into a baseband signal; and insulating material in which the IC and transducer are at least partly embedded, the insulating material holding the transducer and IC in fixed locations spaced relative to each other.

Such a system may further include a dielectric substrate supporting the transducer, IC and insulating material. The insulating material may completely cover the transducer.

FIG. 8 shows a schematic side view of an exemplary communication device 128 including an IC package 130 flip-mounted to an exemplary printed circuit board (PCB) 132. In this example, it may be seen that the IC package 130 may include a die 134, an antenna 136, one or more bond wires, including a bond wire 138, connecting the die 134 to the antenna 136. The die 134, the antenna 136, and the bond wire(s) 138 may be mounted on a package substrate 140 and encapsulated in an encapsulating material 142. The PCB 132 may include a top dielectric layer 144 having a major face or surface 146. The IC package 130 may be flip-mounted to a surface 146 with one or more flip-mounting bumps 148 attached to a metallization pattern (not shown).

The PCB 132 may further include a layer 150 spaced from the surface 146 made of conductive material forming a ground plane. The PCB ground plane may be any suitable structure configured to provide an electrical ground to circuits and components on the PCB 132. The Ground-plane layer 150 is spaced below the antenna 136 by a distance D. The distance D may be less than 1 mm depending on the configuration and dimensions of the IC package 130 and the PCB 132. For example, the PCB ground plane 150 may be located approximately 0.4 mm below mounting surface 146 of the PCB 132, and the antenna 136 may be mounted in a plane approximately 0.25 mm above mounting surface 146, resulting in a distance D of 0.65 mm between the plane of the antenna 136 and the plane of the ground plane.

FIG. 9 shows a simplified exemplary electronic circuit diagram of a transmitter 160 including a transmitter interface circuit 162 and an antenna 164 coupled to the transmit interface circuit. The transmit interface circuit may be located on a die, such as the die 12 shown in the FIGS. 1-3, and may include a transformer 166, a modulator 168, and an amplifier 170. In this example, the transformer 166 is coupled to the antenna 164 and may receive power on a primary winding from a terminal 172. The transformer 166 may provide resonant amplification when combined with a power amplifier, and may provide DC blocking and impedance transformation. The modulator 168 may be any suitable modulator, and is illustrated as a pinch device formed of MOSFETs in a cascade configuration that may receive an input signal on a terminal 174 used to modulate a carrier signal conducted by the amplifier 170. The amplifier 170 in this example may include complementary common-source MOSFETs that are driven by a signal applied to terminals 176 and 178 having a selected carrier frequency produced by a voltage-controlled oscillator.

FIG. 10 shows a simplified circuit diagram showing portions of an exemplary receiver circuit 180. As shown, the receiver circuit 180 may include a receiver interface circuit 182 and an antenna 184. The interface circuit 182 may be included in the integrated circuit in a die, such as the die 12 as illustrated in the FIGS. 1-3. A received modulated radio-frequency (RF) signal, such as a signal in the EHF band, is conducted through the series connections of transformers and transformer-coupled low-noise amplifiers, including a first transformer 186, an amplifier stage 188, a second transformer 190, a second amplifier stage 192, and a third transformer 194. The transformers 186, 190 and 194 may receive a DC bias voltage on respective terminals 196, 198, and 200. Amplifier power may be applied on associated primary windings of the transformers 190 and 194 on respective terminal 202 and 204.

The amplified and conditioned RF signal is input into a demodulator 206 that converts the received modulated RF signal into a baseband signal. The signal output from the demodulator 206 may then be fed into a further output comparator 208. The comparator 208 may also receive an input/output threshold level reference signal from a terminal 210. In this example, the baseband signal is a binary signal. The output from the comparator 208 is a logic 1 if the demodulated baseband signal is above the threshold, and is a logic 0 if the demodulated baseband signal is below the threshold.

One or more comparators may also compare an average level of a monitor signal to a predetermined minimum threshold level to determine if a received signal is strong enough to be considered valid. It may be necessary for the receiver antenna to be sufficiently close to a transmitter antenna to communicate a sufficiently strong signal. A predetermined minimum threshold level may be set to ensure the electromagnetic signal from a transmitter is considered valid and therefore processed by a receiver if the transmitter antenna and receiver antenna are within a desired physical communication range, such as 5 mm to 10 mm.

More specifically, the demodulated baseband signal output from self-mixer 206 may be input into a low-pass filter 212 in combination with the input-output reference provided on the terminal 210. The output of the filter is a monitor signal representative of the average strength of the received demodulated baseband signal, which in turn is representative of the average strength of the received RF signal. This average-strength monitor signal is input to a second comparator 214 along with a signal-detect threshold reference signal received on a terminal 216. The second comparator 214 thereby may monitor the monitor signal output from the filter 212 and may determine whether the received signal is a sufficiently strong signal.

The output from the second comparator 214, then, is a signal-detect control signal that may have one of two states. In a first state, the control signal indicates that the received signal has sufficient strength to be considered a valid signal. In the second state, the control signal indicates that the received signal does not have sufficient strength. The control signal from the second comparator 214 and the demodulated baseband signal from the comparator 208 can be an input into an AND gate 218. The AND gate 218 then may output the baseband signal when the control signal is in the first state, indicating that a sufficiently strong signal is being received. If the control signal is in the second state, the AND gate 218 is disabled, and no baseband signal is output from receiver interface circuit 182. The signal-detect signal output from the second comparator 214 may also be output to other circuits on the die or PCB on which the IC is mounted for other uses as appropriate.

The interface circuit 182 may also have an automatic gain control (AGC) circuit 219. The AGC circuit 219 may include a third comparator 220 that also receives the output from filter 212 as a signal representative of the average strength of the received signal. The third comparator 220 may receive as a reference signal an AGC target level signal on a terminal 222. The third comparator 220 then may produce an output AGC signal that is fed back to amplifier stages 188 and 192 to control the gain of those amplifiers. The AGC circuit 219 may maintain a received sufficiently strong signal at a desired level for output by the receiver interface circuit. It will be seen then that the baseband signal input into signal-detect comparator 214 is a conditioned received signal the level of which is modified by amplifier stages 188 and 192 in response to the AGC control signal. If the monitor signal is not sufficiently strong, even with automatic gain control, then AND gate 218 is disabled and no baseband signal is output.

From the above, it will be apparent that in some examples, a system may include a first transducer configured to convert electromagnetic signals into electrical signals; and a first IC operatively coupled to the transducer, the IC including a receiver circuit for receiving from the transducer a first radio-frequency electrical signal and transforming the first radio-frequency electrical signal into a first baseband signal, and outputting the first baseband signal when a control signal has a first state and not when the control signal has a second state different than the first state, and a signal-detector circuit responsive to a monitor signal representative of the received first radio-frequency electrical signal for generating the control signal with the first state when the monitor signal indicates the received first radio-frequency electrical signal is an acceptable signal and with the second state when the monitor signal indicates the received first radio-frequency electrical signal is not an acceptable signal.

The signal-detector circuit may include a comparator for comparing a characteristic of the monitor signal to a reference, the comparator generating an output signal indicating how the characteristic of the monitor signal compares to the reference, the signal-detector circuit generating the control signal in response to the output signal. The characteristic of the monitor signal may be representative of strength of the received first radio-frequency signal, and the reference is representative of a threshold signal strength below which reception is disabled and above which reception is enabled. The characteristic of the monitor signal may be representative of average signal strength.

In some examples, such a system may further include a second transducer configured to convert electrical signals into electromagnetic signals, the second transducer being disposed sufficiently close to the first transducer for the first transducer to receive electromagnetic signals produced by the second transducer; and a second IC operatively coupled to the second transducer, the second IC containing a transmitter circuit for receiving a second baseband signal and transforming the second baseband signal into a second radio-frequency electrical signal and conducting the second radio-frequency electrical signal to the second transducer.

In some examples, a method may include receiving by a first transducer a first radio-frequency electromagnetic signal; converting by the first transducer the first radio-frequency electromagnetic signal into a first radio-frequency electrical signal; receiving from the transducer by a receiver circuit of an integrated circuit (IC) the first radio-frequency electrical signal; generating a monitor signal representative of the received first radio-frequency electrical signal; monitoring by a signal-detector circuit the monitor signal; determining whether the monitor signal indicates the received first radio-frequency electrical signal is an acceptable signal; generating a control signal with a first state when the monitor signal indicates the received first radio-frequency electrical signal is an acceptable signal and with a second state different than the first state when the monitor signal indicates the received first radio-frequency electrical signal is not an acceptable signal; transforming by the receiver circuit the first radio-frequency electrical signal into a first baseband signal when the control signal has the first state; and not transforming by the receiver circuit the first radio-frequency electrical signal into a first baseband signal when the control signal has the second state.

Determining whether the monitor signal indicates the received first radio-frequency electrical signal is an acceptable signal may include comparing a characteristic of the monitor signal to a reference; generating an output signal indicating how the characteristic of the monitor signal compares to the reference; and generating the control signal includes generating the control signal in response to the output signal. The characteristic of the monitor signal may be representative of strength of the received first radio-frequency signal, and the reference may be representative of a threshold signal strength below which reception is disabled and above which reception is enabled. The characteristic of the monitor signal may be representative of average signal strength In some examples, such a method may further include receiving by a second IC containing a transmitter circuit a second baseband signal; transforming the second baseband signal into a second radio-frequency electrical signal; conducting the second radio-frequency electrical signal to a second transducer; positioning the second transducer sufficiently close to the first transducer for the first transducer to receive electromagnetic signals produced by the second transducer; and converting by the second transducer the second radio-frequency electrical signal into the first radio-frequency electromagnetic signal.

FIG. 11 shows an isometric view of another exemplary communication device 230 including an IC package 232 with external circuit conductors 234-236. In this example, the IC package 232 may include a die 238, a lead frame 240, conductive connectors 242 in the form of bond wires, an antenna 244, an encapsulating material 246, and other components not shown to simplify the illustration. The 238 may be mounted in electrical communication with the lead frame 240, which may be any suitable arrangement of electrical conductors 248 (or herein after leads 248) configured to allow one or more other circuits to operatively connect with the die 238. The antenna 244 may be constructed as a part of the manufacturing process that produces the lead frame 240.

The leads 248 may be embedded or fixed in a lead frame substrate 250, shown in phantom lines, corresponding to package substrate 34 shown in FIG. 2. The lead frame substrate 250 may be any suitable insulating material configured to substantially hold the leads 248 in a predetermined arrangement. Electrical communication between the die 238 and the leads 248 of the lead frame 240 may be accomplished by any suitable method using the conductive connectors 242. As mentioned, the conductive connectors 242 may include bond wires that can electrically connect terminals on a circuit of the die 238 with corresponding conductors 248. For example, the conductor 248 may include a plated lead 252 formed on an upper surface of the lead frame substrate 250, a via 254 extending through the substrate, a flip-mounting bump 256 mounting the IC package 232 to a circuit on a base substrate, such as a PCB, not shown. The circuit on the base substrate may include external conductors, such as external conductor 234, which for example, may include a strip conductor 258 connecting bump 256 to a further via 260 extending through the base substrate. Other vias 262 may extend through the lead frame substrate 250 and there may be additional vias 264 extending through the base substrate.

In another example, the die 238 may be inverted and the conductive connectors 242 may include bumps, or die solder balls, as described previously, which may be configured to electrically connect points on a circuit of the die 238 directly to correspond the leads 248 in what is commonly known as a "flip chip" arrangement.

The lead frame 240 may be configured to create what may be considered a radiation shaper 266 forming effectively a wire mesh backstop for radiation transmitted by the antenna 244 or radiation received from an external antenna. Other circuit connectors may also contribute to the radiation reflector, including the conductive connectors 242, various combinations of the external conductors 234 and 236. The conductors 234-236 may conduct active signals or be circuit grounds because electromagnetic signals of sufficiently high frequencies that both types of conductors 234-236 contribute to the reflections or shaping of the radiation. The shaping effect applies to received as well as transmitted radiation. Additionally, various shaping effects are possible, and it may be desirable in some embodiments to have reduced or insubstantial directional shaping effect, essentially creating an electromagnetic signal with omni-directional or hemispherical qualities.

FIG. 12 shows a bottom view of the exemplary communication device 230. The lead frame 240 may be configured with the conductors 248 separated by a pin pitch or gap, such as distance G shown in FIG. 12. Distance G may be effective if it is significantly less than one wavelength of an operating frequency of the transmitter or receiver. For example, the pin pitch may be configured to be 1/10th of the wavelength. This configuration may effectively create a wire mesh, providing a backstop for antenna 244 and directionally shaping an associated electromagnetic signal and directing it substantially away from die 238.

FIGS. 13 and 14 illustrate a representative or a characteristic radiation pattern 270 resulting from the communication device 230 of FIG. 11. The characteristic pattern 270 may be produced by a simulation of an electromagnetic signal emanating from an exemplary transmitting IC package 232 having the radiation shaper 266 described with reference to FIGS. 11 and 12. The indicated layers represented in the figures generally corresponds with increasing gain with distance from IC package 232 As seen by the radiation patterns in FIGS. 13 and 14, the radiation is directed away from die 238 and lead frame 240, shown in FIGS. 11 and 12, in a direction corresponding to the side of die 238 on which antenna 244 is mounted.

Further or alternative shaping of the electromagnetic signal may be accomplished by the configuration of a ground plane 150 in a PCB 132 of a communication device as described with reference to FIG. 8, generally deflecting an electromagnetic signal in a direction dependent on the configuration of the PCB ground plane 150 relative to the antenna 136 embedded in the right end of the IC package 130 as viewed in FIGS. 15 and 16. These figures illustrate idealized radiation patterns that may result from different configurations, and are not the results of simulations of these configurations. Actual radiation patterns are dependent on relative configurations, actual structures, and the strength of applied signals.

In the configuration shown in FIG. 15, the ground plane 150 extends out past the antenna 136 in the IC package 130 by a distance F that is well beyond the antenna opposite from the position of the die 134. It is seen that resulting radiation 280 can extend upwardly away from the ground plane 150 and away from the IC package 130.

FIG. 16 shows a communication device 500 with an exemplary dielectric lens 390, generally indicated as 400. The lens 400 in this example being formed as an integral part of a mounting structure 402 and mounted on an enclosure 404 of the communication device 500. The dielectric lenses 390, such as lens 400, may be used to redirect, collimate, focus, and/or defocus a radiation signal. Generally speaking, the dielectric lens 390 may be a structure that may be constructed of one or more materials that refract radio frequency radiation, the lens 390 being shaped and configured to converge or diverge a transmitted signal. In an embodiment, the dielectric lens 390 may be configured to refract incident EHF electromagnetic radiation. The dielectric lens 390 may be disposed so as to enhance transmission and/or reception of the EHF electromagnetic signal by the transducer. The dielectric lens 390 may be mounted at least partially in a path of the EHF electromagnetic signal, such that at least a portion of the EHF electromagnetic signal is refracted by the dielectric lens 390. The dielectric lens 390 may be configured to create a focal point for incident EHF electromagnetic radiation, and at least a portion of the transducer is disposed at the focal point created by the dielectric lens 390.

The communication device 500 may include an IC package 502, the general position of which is indicated in FIG. 16 in dashed-line because it lies beneath enclosure 404 and/or mounting structure 402. The IC package 502, like previously described IC packages, may also include an antenna (not shown), and may be configured to receive and/or transmit an electromagnetic signal in the EHF frequency range via the antenna. The communication device 500 may include an enclosure that at least partly encloses the integrated circuit package 502, wherein the dielectric lens 390 is integral with the enclosure, and may be integral with the IC package. The focal point created by the dielectric lens 390 may lie outside the dielectric lens 390.

The example shown in FIG. 16 may have a substantially solid spheroidal lens 400. The lens 400 may be formally described as incorporating two convex spherical caps 406, such as, a first spherical cap 406A and a second spherical cap 406B. The lens 400 may be fabricated using any appropriate technique and any appropriate dielectric material, and may therefore correspond to a seamless solid spheroid. For the purpose of describing the geometry of the lens, however, a formal definition of the lens 400 as incorporating a first and a second spherical cap may be helpful. A spherical cap may be defined as a lens structure having a surface that is a portion of a sphere that lies on one side of a plane passing through the sphere. The lens surface conforming to the portion of the sphere may be convex or concave. Each spherical cap of the dielectric lens may have one or more different characteristics as further described in detail in FIG. 17.

FIG. 17 is a representation of the biconvex dielectric lens 400 formally split into constituent spherical caps 406A and 406B. As shown in FIG. 17, each spherical cap may have a planar base 408, such as a first planar base 408A and a second planar base 408B, respectively. In the case of a concave surface, the edges of the spherical surface portions may define a base plane. Other, non-planar base shapes may also be used. Each of the planar bases 408A-408B in the example shown may have a base radius 410, such as the base radii labeled b1 and b2 in FIG. 17. For example the first planar base 408A has a first base radius and the second planar base 408B has a second base radius and the first base radius (b1) is substantially equal to the second base radius (b2). Further, the first spherical cap 406A may have a first radius of curvature, the second spherical cap 406B may have a second radius of curvature, and the first radius of curvature and second radius of curvature are not equal. In a particular embodiment, the ratio of the first radius of curvature to the second radius of curvature may be in the range of about 9:9.2, or approximately 0.98:1.

Each of the spherical caps 406A-406B may also have a height 412 defined as the orthogonal distance from the center of the planar base 408 to the outer surface of the cap 406A or 406B. The heights 412 for the respective caps 406A-406B are labeled as d1 and d2 in the example of FIG. 17. The first spherical cap 406A may have a first height d1 that is substantially equal to the first radius of curvature, such that the first spherical cap 406A substantially corresponds to a hemisphere. The second spherical cap 406B may have a second height d2 that is less than the second radius of curvature, and the second spherical cap 406B may define a second hemisphere. The second spherical cap 406B may have a second height i.e. d2 that may be substantially equal to the second radius of curvature, such that the second spherical cap 406B corresponds to a hemisphere.

The dielectric lens 400 may be constructed with various characteristics to alter performance of the lens, such as altering the focal point of the lens. For example, lens 400 may be constructed such that the first height d1 is substantially equivalent to the second height d2, in which case the lens 400 would be a sphere. In other examples, such as the one depicted in FIGS. 1 and 2, the first height d1 may be substantially larger than the second height d2.

A cross section of lens 400 as shown in FIG. 3 may indicate certain other characteristics. For example, because spherical caps 406A and 406B may be formed such that planar bases 408A and 408B have the same radii (i.e., b1=b2), and such that the bases are facing each other and the caps 406A-406B are formed as one continuous lens structure, an overall thickness "d" of lens 400 may be defined as d1+d2. Additionally, each spherical cap i.e. 406A-406B may have a radius of curvature 414, such as radius r1 and r2, which may be defined as a radius of the hypothetical sphere from which the spherical cap was formed.

It may be appreciated that a spherical cap having a radius of curvature equivalent to its height would constitute a hemisphere. In the example of lens 400, the spherical cap 406A may be such a hemisphere, while the spherical cap 406B may have a height substantially less than its radius of curvature. Other configurations are possible, such as a lens where each spherical cap is a hemisphere, thus forming a spherical lens. In other examples, combinations of spherical caps having various heights may be used, including heights greater or less than respective radii of curvature. In the examples shown, base radii 410 of the caps are substantially equivalent. In other examples, the base radius of cap 406A may be different than the base radius of cap 4068.

One result of the particular configuration of spherical caps 406A-406B can be based on varying focal length of the lens 400 based on the first height d1 and the second height d2. An EHF signal passing from one medium to another may be refracted. For example, a signal may be refracted when passing from air to a dielectric material and when passing from a dielectric material back into the air. The signal may thus be focused on a particular point known as the focal point 416, as shown in FIG. 18. If the second height d2 is relatively large, the focal point 416 may fall within the lens itself. For example, a completely spherical dielectric lens 400 may result in a focal point inside the lens.

Some benefit from the lens 400 is still possible in this configuration, by placing an antenna near or in contact with the lens 400. However, an antenna should be substantially co-located with the focal point 416 in order to fully benefit from the focusing properties of the lens 400. Various solutions may be possible, such as embedding the antenna inside the lens 400. While embedding is an option taught by this disclosure, in the example shown in the drawings, the focal point 416 is relocated outside the lens 400 by reducing height d1. This facilitates placement of an antenna at the focal point 416 without embedding or contacting the lens 400. A gap between the lens 400 and the IC package may facilitate shock resistance of the communication device 500 by providing space for components to move relative to one another without propagating damage.

The dielectric lenses 390 such as the lens 400 may be constructed at least in part of any suitable dielectric material having a dielectric constant that is higher than that of the material surrounding it. For example, where the dielectric lens is surrounded by air, the dielectric lens may be constructed from any dielectric material having a dielectric constant higher than that of the air around it. For example, acrylonitrile butadiene styrene (ABS) plastic may be used. Additionally, dielectric lenses may be constructed by any suitable method and may include a substantially homogeneous material. For example, a rapid prototyping machine, also known as a 3-D printer, may be used to create lenses 390 of ABS plastic. This method of manufacture also typically allows a manufacturer to choose from a plurality of densities. The dielectric lens 400 may further include a dielectric material, such as ABS, having an index of refraction between 1.2 and 2.0. A lens having an index of refraction of about 1.47 as measured at 60 GHz may be particularly useful.

Additionally, using ABS plastic with an index of refraction of 1.47, the lens 400 may have radii of curvature 414 where a ratio of r1 to r2 is approximately 9.0:9.2. For example, a lens 400 may have r1=9.0 mm, r2=9.2 mm, d1=9.0 mm, d2=7.3 mm, d=16.3 mm, and focal length of 7.5 mm. Accordingly, the focal point 416 may be located at a point that is focal length (7.5 mm) minus d2 (7.3 mm), or 0.2 mm from the surface of the lens 400.

It is noted that the inventors have achieved significant increases in the range of a transmitted EHF signal using examples of dielectric lens 400. It is also noted that the lens 400 may provide benefits when installed on a transmitter, a receiver, or both. Use of the lens 400 on both a transmitter and a receiver may result in increases from approximately a 2 cm communication range to approximately a 1 m communication range.

As shown in FIG. 16 and FIGS. 19-22, the dielectric lens 400 may be manufactured as part of the enclosure 404 or the mounting structure 402, which may be a removable portion of the enclosure 404. Also shown in these drawings are various sizes and configurations of the dielectric lens 400, including fully spherical lenses 400. As discussed above, other examples (not shown) may have a lens manufactured as an integral part of IC package 502 and/or may have an antenna embedded in the lens.

FIGS. 23 and 24 show an example of a biconcave dielectric lens 430. The lens 430 may be similar in materials and manufacturing methods to the lens 400 formed by two convex spherical caps 406A and 406B. In contrast to the lens 400, however, the biconcave dielectric lens 430 may be configured to cause at least a portion of an incident EHF electromagnetic signal to disperse and/or diverge a signal rather than focusing or converging the signal. This may be desirable, for example, to facilitate spreading a transmitted signal over a broader area in order to reduce the precision required when aligning two communication devices such as communication device 500.

The biconcave dielectric lens 430 may be constructed of a dielectric material and may include a first concave spherical surface 432 formed in spherical cap 433 and a second concave spherical surface 434 opposite surface 432 formed in spherical cap 435. Each of the concave surfaces 432 and 434 may have a radius of curvature, and the radii of curvature may be different from each other in order to ensure a focal point is conveniently located for the corresponding IC package to achieve proper antenna placement. In this example, the concave surfaces have edges disposed on respective base planes represented by the left and right edges of lens 430 as shown in FIG. 23.

The biconvex dielectric lens 400 or the biconcave dielectric lens 430 may include at least one surface configured to function as a Fresnel lens 440 with respect to an incident EHF electromagnetic signal. The Fresnel lens surface may have a number of Fresnel zones. In yet another example of a dielectric lens 390 suitable for EHF communication using IC packages, the Fresnel lens 440 such as the one shown in FIGS. 25-27 may be used to focus and extend the range of an EHF transmission. The Fresnel lens 440 may be any suitable Fresnel lens constructed of a dielectric material and configured to focus an EHF-frequency electromagnetic signal. Fresnel lens 440 may include a plurality of Fresnel zones 442. In the example shown in FIG. 25, five Fresnel zones 442 may be used.

As before, the lens 390 may include two portions, with bases of two Fresnel lenses 444A and 444B being joined or operatively connected to form a single bi-Fresnel lens 446. The Fresnel lens portion 444A may have different characteristics from Fresnel lens portion 444B to facilitate a desired focal point.

One benefit of using a Fresnel lens is a reduced overall lens thickness, mass, and volume. In one example, the inventors have created a Fresnel lens 440 having a 9 mm radius of curvature that resulted in an overall lens thickness of only 4 mm, but still increased transmission distance by 27%. This reduced thickness also facilitates incorporating the lens into a device enclosure, case, or mounting structure without unsightly or undesirable form factor changes.

In yet another embodiment of the invention, the dielectric lens structure may have the form of a spherical convex cap fused to or otherwise integral with an enclosure or mounting structure. As discussed above for dielectric lens structures that incorporate two spherical caps, the single spherical cap may have a radius of curvature equivalent to its height, thereby constituting a hemisphere. Alternatively, the spherical cap may have a height greater than, or less than, its radius of curvature, depending on the nature and quality of the desired refraction of incident EHF electromagnetic radiation.

In an alternative aspect of the invention, the dielectric lens includes a single concave or convex spherical cap that is fused to or otherwise integral with a mounting structure, and the opposite surface of the mounting structure is substantially lacking features. For example, the surface opposite the dielectric lens may be substantially planar as indicated in FIG. 28. Typically, the base plane of such a single spherical cap is configured so that it is oriented substantially perpendicularly to the direction of propagation of the EHF electromagnetic signal to be modified.

In another aspect of the invention, the dielectric lens includes a single concave spherical cap that is set into a mounting structure, where the opposite surface of the mounting structure from the concave spherical cap may be substantially planar. A concave spherical cap may be used where it may be desirable to disperse and/or diverge an EHF electromagnetic signal, rather than focusing or converging the signal.

Alternatively, or in addition, the dielectric lens having a single spherical cap may be combined with one or more additional lenses also having single spherical caps. The multiple lenses may have the same or differing heights, may be convex or concave, and may be configured to refract incident EHF electromagnetic radiation towards or away from the same or different transducer.

An exemplary dielectric lensing structure 500 is depicted in FIG. 28. As shown, the dielectric lensing structure 500 includes two discrete lenses 502A and 502B, each lens having the form of a convex spherical cap. As shown, lenses 502A and 502B are mounted upon and fused to an inner surface of a housing 504, where the housing may be featureless on side of the housing opposite the lens structures, for example the outer surface of the housing. The base planes of lens halves 502A and 502B may be disposed substantially perpendicularly to the path of propagation of the EHF electromagnetic signal to be modified.

As shown in FIG. 29, lensing structure 500 may be incorporated into a housing 506A, 506B, where each housing may include a pair of integrated circuit packages 508A, 508B, and 510A and 5108. Each integrated circuit package may include a die 512 and a transducer 514 as described previously. Lenses 516A and 518A may be oriented to form a composite lens, with the adjacent planar outer surface of each housing being oriented perpendicularly to a signal path extending between the opposing transducers. As a result, EHF electromagnetic signals 517 may be transmitted between integrated circuit package 508A and integrated circuit package 510A via the composite lens structure formed by lenses 516A and 518A. Similarly, lenses 516B and 518B may be oriented so that EHF electromagnetic signals 519 may be transmitted between integrated circuit package 508B and integrated circuit package 5108. EHF electromagnetic signals 517 may be transmitted simultaneously with EHF electromagnetic signals 519 without interference, due to the ability of the dielectric lenses to refract each set of signals separate from the other.

It will thus be appreciated that locating an antenna or other transducer off-chip may result in effective antenna impedance matching, independent antenna design, increased transmission power, and selective directional shaping of a resulting radiation pattern. The radiation may thus be directed in a direction where a receiving antenna may be positioned. Locating an antenna within the package may also provide a customer with a more complete assembly that incorporates characteristics of the assembly to satisfy specifications and tailored operating characteristics, besides protecting an incorporated antenna from damage.

It will also be appreciated that radiation patterns may be refracted into a convergent, more collimated, or divergent pattern as desired, by adding dielectric lenses having various configurations and properties. These lenses may be incorporated in a device enclosure or in the IC package itself.

The present disclosure also provides a communication device including an IC package for communicating an electromagnetic signal at an EHF frequency. The communication device may also include a dielectric lens (e.g. 400) configured to refract the electromagnetic signal. The dielectric lens may be mounted at a fixed distance from the IC package at least partially in a path of the electromagnetic signal. The IC package may include an antenna configured to convert between electrical signals and electromagnetic signals and an integrated circuit (IC) operatively coupled to the antenna. The IC may contain at least one of a transmitter circuit and a receiver circuit. The IC package may include an insulating material in which the IC and antenna are at least partly embedded. The insulating material may hold the antenna and IC in fixed locations spaced relative to each other.

Further, the dielectric lens may have a focal point, and the antenna of the IC package may be located substantially at the focal point. The dielectric lens may also include a solid lens having a first spherical cap having a first planar base and a second spherical cap may have a second planar base operatively connected to the first planar base. The first spherical cap may have a first radius of curvature, and the second spherical cap may have a second radius of curvature. The first spherical cap may have a first height substantially equivalent to the first radius of curvature. The first spherical cap may substantially define a first hemisphere. The second spherical cap may have a second height substantially less than the second radius of curvature.

In an embodiment, a ratio of the first radius of curvature to the second radius of curvature is approximately 9 to approximately 9.2. The second spherical cap may have a second height which can be substantially equivalent to the second radius of curvature and the second spherical cap may substantially define a second hemisphere. Further, the first and second spherical caps may be directly and continuously connected. In addition, the first planar base may have a first base radius and the second planar base may have a second base radius and the first base radius can be substantially equal to the second base radius.

The present disclosure may also provide a system including a first device including a first IC package having a first antenna and configured to transmit an electromagnetic signal in the EHF frequency range, and a first dielectric lens disposed adjacent the first antenna such that at least a portion of the electromagnetic signal is refracted by the first dielectric lens. The communication device may also include a second device spaced at a distance from the first device, the second device including a second IC package having a second antenna and configured to receive the electromagnetic signal transmitted by the first IC package and refracted by the first dielectric lens. The system may also include a second dielectric lens disposed adjacent to the second antenna. The dielectric lens may include a solid lens having a first spherical cap with a first planar base and a second spherical cap with a second planar base operatively connected to the first planar base. The first spherical cap may have a first radius of curvature, and the second spherical cap may have a second radius of curvature.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. An EHF communication system comprising:
a first device comprising a first integrated circuit package having a first transducer configured to transmit an electromagnetic signal in an EHF frequency range;
a first dielectric lens disposed adjacent the first transducer such that at least a portion of the electromagnetic signal is refracted by the first dielectric lens; and
a second device including a second integrated circuit package having a second transducer configured to receive the electromagnetic signal refracted by the first dielectric lens, wherein the first dielectric lens has a first surface and a second surface opposite the first surface, the first surface facing the first integrated circuit package having the first transducer and the second surface facing the second integrated circuit package having the second transducer, and wherein the first dielectric lens is a biconvex lens comprising a combination of a first spherical cap in a first housing of the first device and a second spherical cap is in a second housing of the second device.

2. The EHF communication system of claim 1, wherein the first spherical cap comprises a first base having a first base radius and the second spherical cap comprises a second base having a second base radius, the first base radius substantially equal to the second base radius;
wherein the first spherical cap has a first spherical surface with the first radius of curvature and the second spherical cap has a second spherical surface with the second radius of curvature.

3. The EHF communication system of claim 2, wherein the first dielectric lens includes a homogeneous material having an index of refraction between 1.2 and 2.0 measured at 60 GHz.

4. The EHF communication system of claim 2, wherein the first spherical cap has a first height that is substantially equal to the first radius of curvature, such that the first spherical surface substantially corresponds to a hemisphere.

5. The EHF communication system of claim 2 wherein the second spherical surface has a second height that is less than the second radius of curvature.

6. The EHF communication system of claim 5, wherein the ratio of the first radius of curvature to the second radius of curvature is in the range of about 9 to about 9.2.

7. The EHF communication system of claim 2, wherein the second spherical cap has a second height that is substantially equivalent to the second radius of curvature, such that the second spherical surface substantially corresponds to a hemisphere.

8. The EHF communication system of claim 1, wherein:
the first integrated circuit package comprises a transmitter circuit configured to convert a first baseband signal into an EHF electrical signal, the transducer configured to convert the EHF electrical signal into the electromagnetic signal; and
the second integrated circuit package comprises a receiver circuit configured to convert an EHF electrical signal from the second transducer into a second baseband signal.

* * * * *